US012677649B2

(12) United States Patent
Kawanishi et al.

(10) Patent No.: US 12,677,649 B2
(45) Date of Patent: Jul. 7, 2026

(54) SEMICONDUCTOR MEMORY DEVICE

(71) Applicant: Kioxia Corporation, Tokyo (JP)

(72) Inventors: Ayako Kawanishi, Yokkaichi (JP); Kanako Shiga, Yokkaichi (JP); Takeo Mori, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 1022 days.

(21) Appl. No.: 17/654,440

(22) Filed: Mar. 11, 2022

(65) Prior Publication Data

US 2023/0090711 A1 Mar. 23, 2023

(30) Foreign Application Priority Data

Sep. 17, 2021 (JP) ................................. 2021-152447

(51) Int. Cl.
*H10B 43/27* (2023.01)
*H10W 20/20* (2026.01)
(52) U.S. Cl.
CPC ............ *H10W 20/20* (2026.01); *H10B 43/27* (2023.02)
(58) Field of Classification Search
CPC ........ H10B 41/40; H10B 43/27; H10B 43/10; H10B 43/20; H10B 43/50; H01L 23/535
See application file for complete search history.

(56) References Cited

U.S. PATENT DOCUMENTS

| | | | | |
|---|---|---|---|---|
| 8,969,843 | B2 * | 3/2015 | Ohba ................... | H10N 70/826 |
| | | | | 257/E45.001 |
| 10,756,185 | B2 * | 8/2020 | Choi .................... | H10D 62/292 |
| 2016/0093626 | A1 * | 3/2016 | Izumi .................... | H10B 43/35 |
| | | | | 257/324 |
| 2018/0190540 | A1 * | 7/2018 | Liu ..................... | H10W 20/076 |
| 2018/0331119 | A1 | 11/2018 | Kim et al. | |
| 2022/0285372 | A1 * | 9/2022 | Choi ...................... | H10B 43/27 |

* cited by examiner

*Primary Examiner* — Matthew C Landau
*Assistant Examiner* — Vincent Kipkemoi Rono
(74) *Attorney, Agent, or Firm* — Oblon, McClelland, Maier & Neustadt, L.L.P.

(57) ABSTRACT

According to one embodiment, a semiconductor memory device incudes: a stacked body in which a plurality of first conductive layers and a plurality of first insulating layers are alternately stacked one by one; and a contact that extends in the stacked body in the stacking direction, and is connected to a structure arranged on in the stacked body or below the stacked body. The contact includes: a second conductive layer that extends in the stacked body LM in the stacking direction, and serves as a core of the contact; and a second insulating layer that covers a sidewall of the second conductive layer, and serves as a liner of the contact. At least at a point close to the structure, when viewed in a cross section taken in a direction intersecting the stacking direction, a variation, in a circumferential direction of the contact, of a first distance from a center point of the second conductive layer to an outer edge of the second insulating layer is larger than a variation, in the circumferential direction of the contact, of a second distance from the center point to an outer edge of the second conductive layer.

18 Claims, 21 Drawing Sheets

X-DIRECTION

Y-DIRECTION

X-DIRECTION

FIG.2A

X-DIRECTION

Y-DIRECTION

Y-DIRECTION

Y-DIRECTION

Y-DIRECTION

Y-DIRECTION

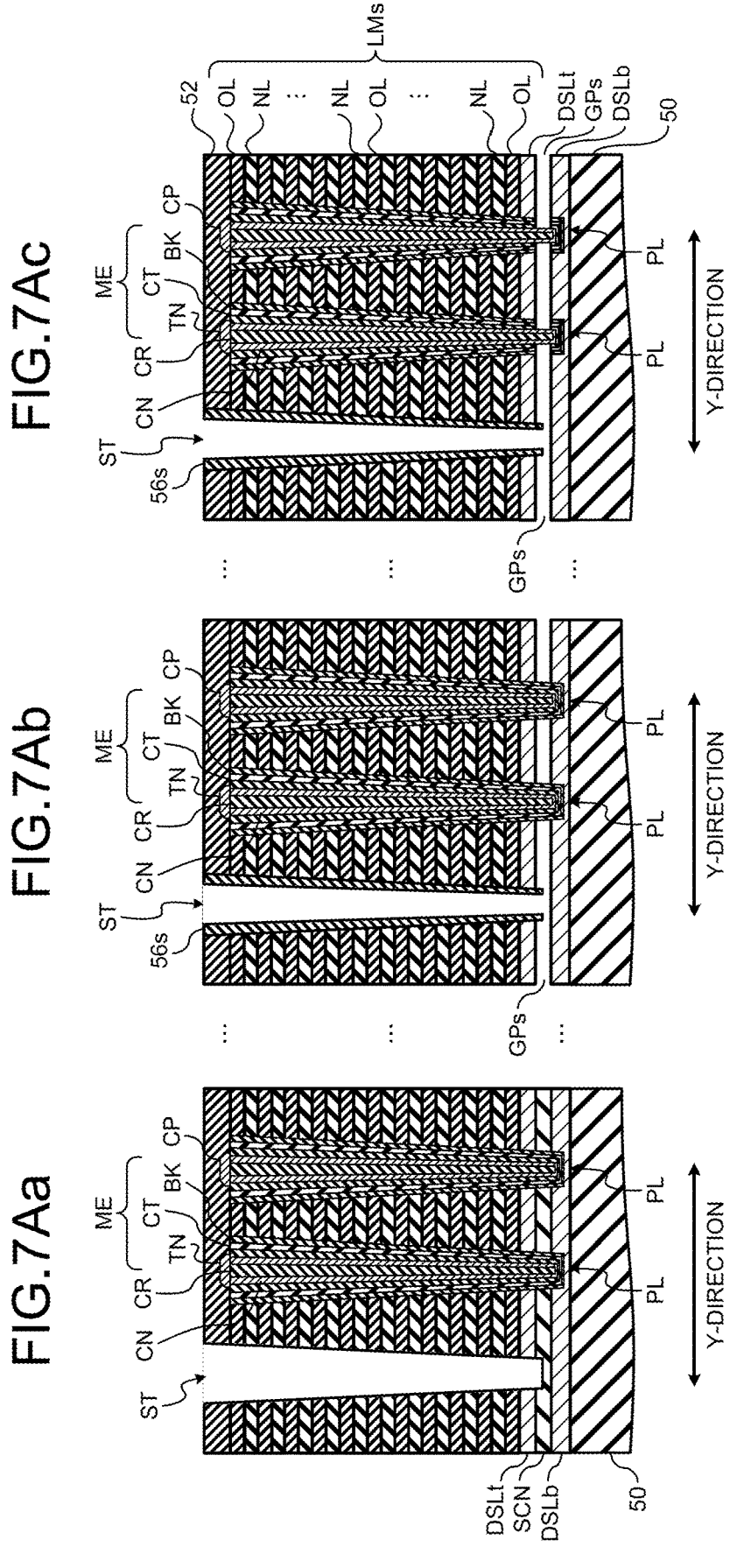

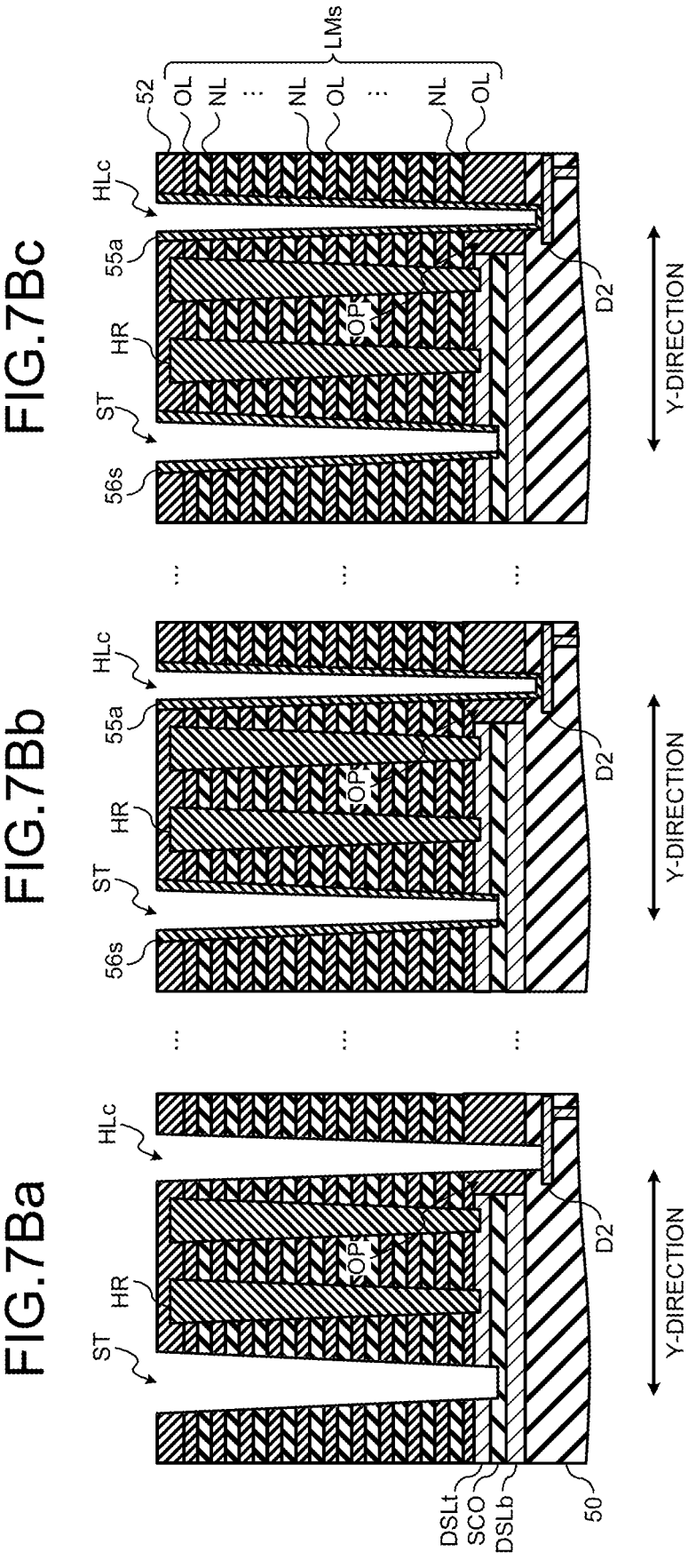

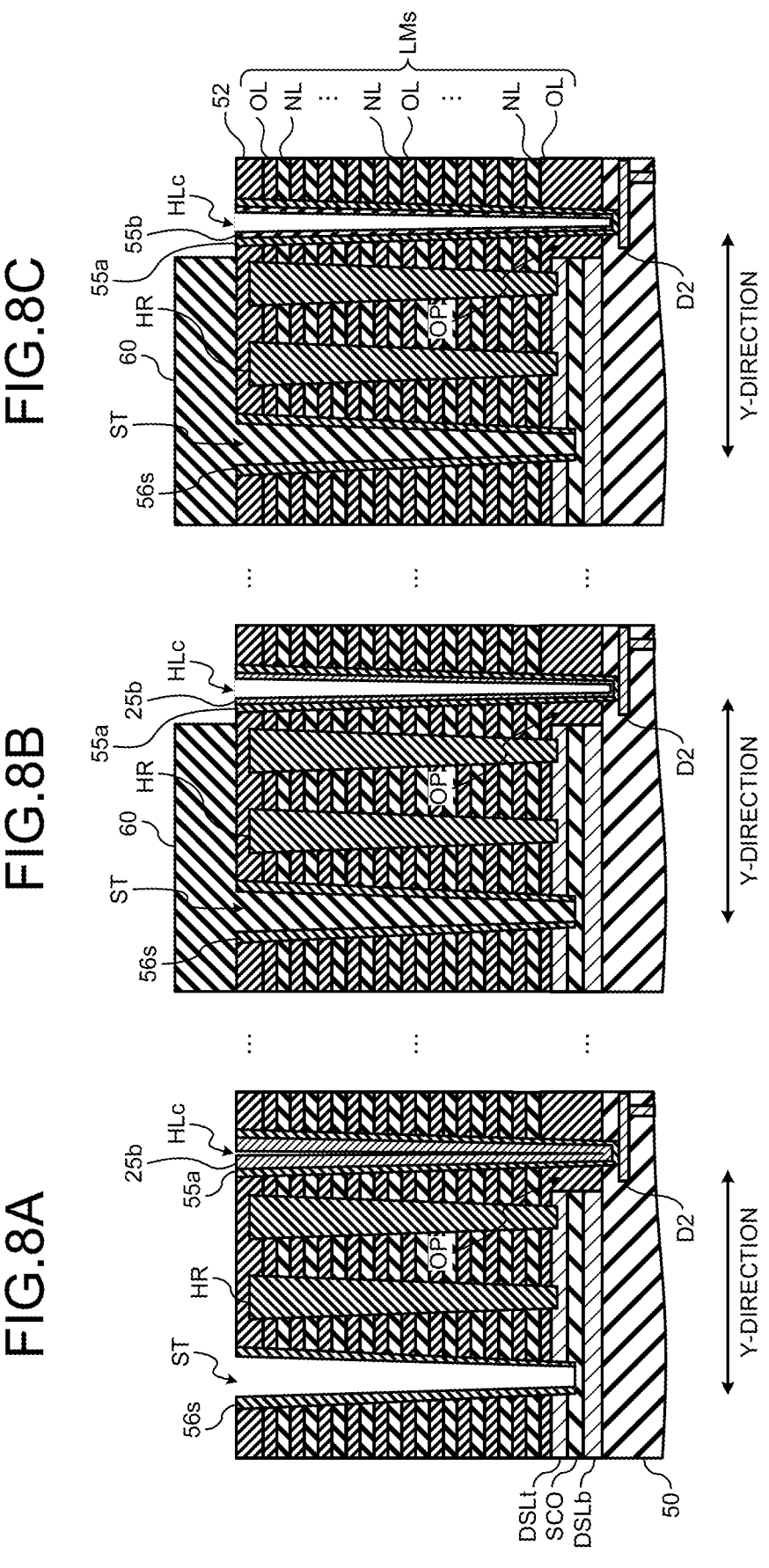

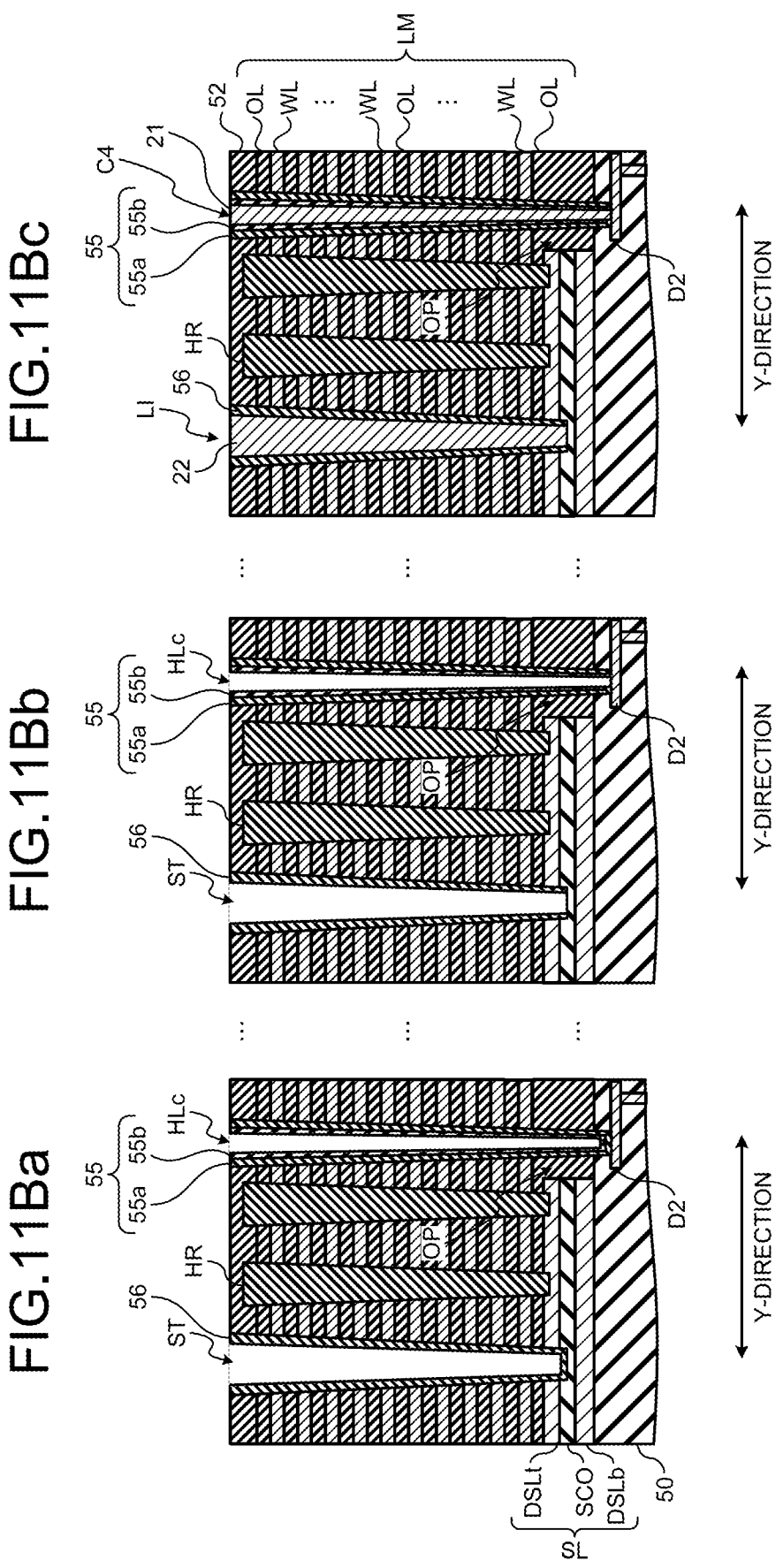

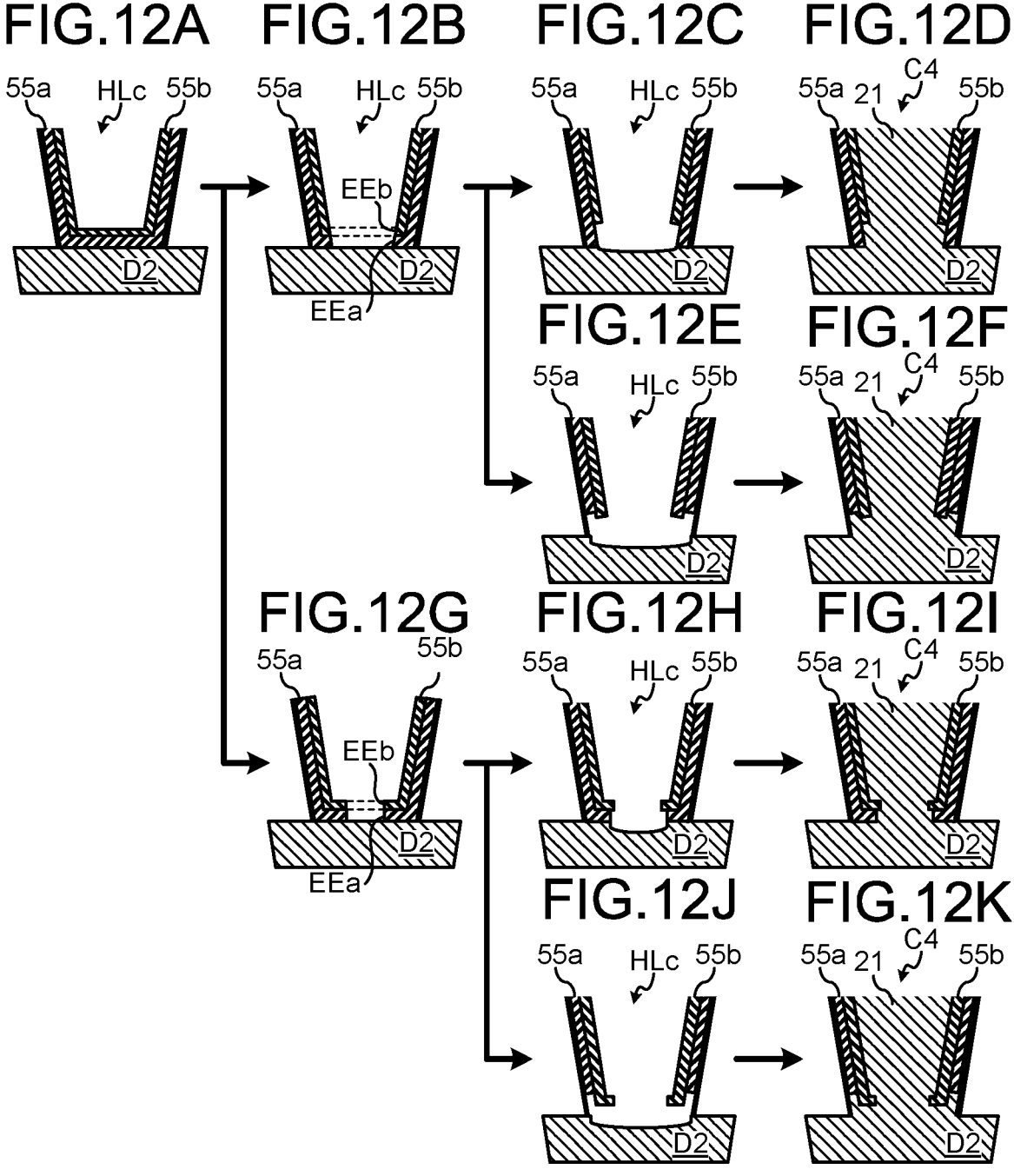

SEMICONDUCTOR MEMORY DEVICE

CROSS-REFERENCE TO RELATED APPLICATIONS

This application is based upon and claims the benefit of priority from Japanese Patent Application No. 2021-152447, filed on Sep. 17, 2021; the entire contents of which are incorporated herein by reference.

FIELD

Embodiments described herein relate generally to a semiconductor memory device.

BACKGROUND

Some semiconductor memory devices, such as three-dimensional nonvolatile memory, have a contact in a stacked body in which a plurality of conductive layers and a plurality of insulating layers are alternately stacked. The contact in this case would sometimes have a distorted shape, and would fail in achieving a sufficient level of withstand voltage between the plurality of conductive layers and the contact.

BRIEF DESCRIPTION OF THE DRAWINGS

FIGS. 2A to 2D are cross-sectional views illustrating the semiconductor memory device according to the first embodiment;

FIGS. 8A to 8C are drawings sequentially illustrating the part of exemplary procedures of the method for manufacturing the semiconductor memory device according to the first embodiment;

FIGS. 12A to 12K are drawings sequentially illustrating the part of exemplary procedures of the method for manufacturing the semiconductor memory device according to the first embodiment;

FIGS. 16A to 16D are cross-sectional views illustrating exemplary structures of a semiconductor memory device according to other embodiment.

DETAILED DESCRIPTION

In general, according to one embodiment, a semiconductor memory device includes: a stacked body in which a plurality of first conductive layers and a plurality of first insulating layers are alternately stacked one by one; a plurality of pillars that extends in the stacked body in a stacking direction of the stacked body, and each forms a memory cell at respective intersections with at least a part of the plurality of first conductive layers; and a contact that extends in the stacked body in the stacking direction, and is connected to a structure arranged in the stacked body or below the stacked body, the contact including: a second conductive layer that extends in the stacked body in the stacking direction, and serves as a core of the contact; and a second insulating layer that covers a sidewall of the second conductive layer, and serves as a liner of the contact, the contact being designed so that at least at a point close to the structure, when viewed in a cross section taken in a direction intersecting the stacking direction, a variation, in a circumferential direction of the contact, of a first distance from a center point of the second conductive layer to an outer edge of the second insulating layer is larger than a variation, in the circumferential direction of the contact, of a second distance from the center point to an outer edge of the second conductive layer.

Exemplary embodiments of the semiconductor memory device will be explained below, referring to the accompanying drawings. The present invention is not limited to the following embodiments. Also note that constituents in the following embodiments include those that would be easily conceived by a person skilled in the art, or those that are substantially the same.

First Embodiment

A first embodiment will be detailed below, referring to the accompanying drawings.
(Exemplary Structure of Semiconductor Memory Device)

Figures 1A, 1B:
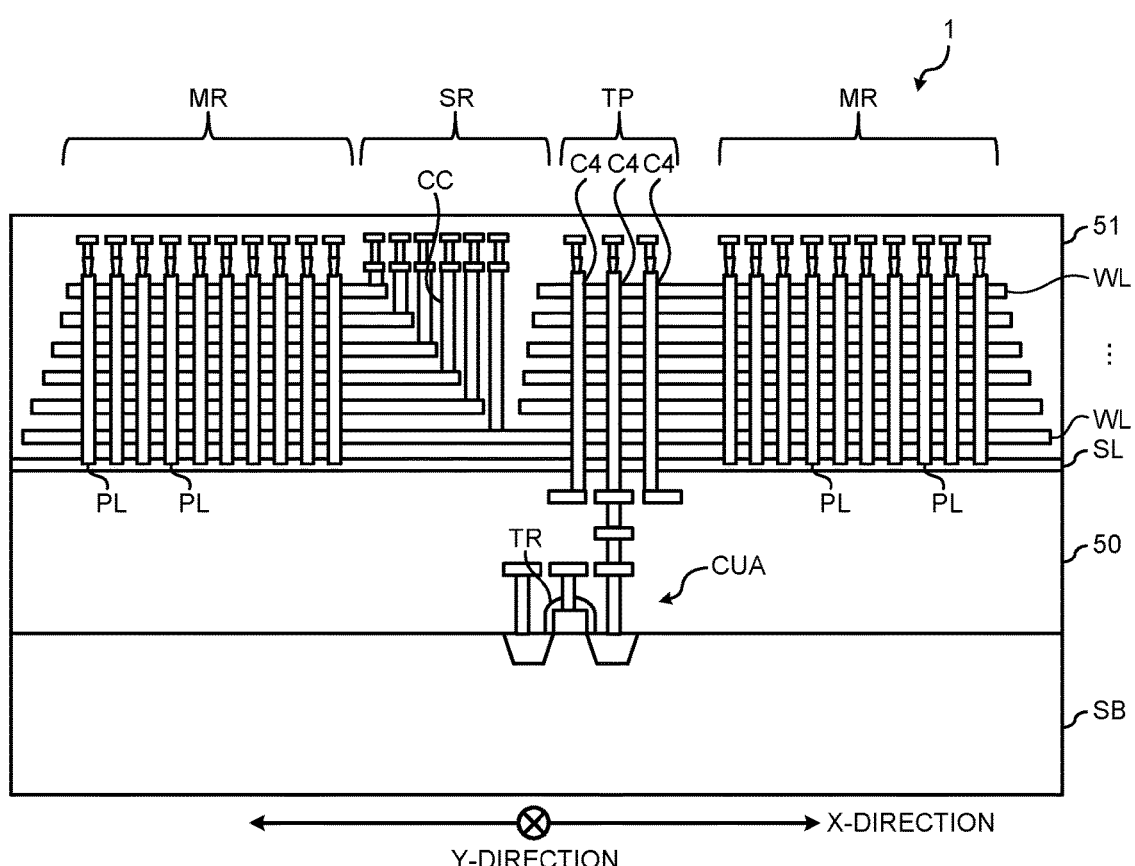
FIGS. 1A and 1B are drawings illustrating an exemplary schematic structure of a semiconductor memory device according to a first embodiment.

FIGS. 1A and 1B are drawings schematically illustrating an exemplary structure of a semiconductor memory device 1 according to the first embodiment. FIG. 1A is a cross-sectional view of the semiconductor memory device 1 taken along the X-direction, and FIG. 1B is a schematic plan view illustrating a layout of the semiconductor memory device 1. FIG. 1A is presented without hatching for better visibility. FIG. 1A is also presented without a part of an upper wiring.

In the present specification, both the X-direction and the Y-direction are laid along a face of a word line WL described later, where the X-direction and the Y-direction are orthogonal to each other. A direction the word line WL is electrically led out may occasionally be referred to as a "first direction", which is laid in a direction along the X-direction. Meanwhile, a direction that crosses the first direction may occasionally be referred to as a "second direction", which is laid in a direction along the Y-direction. Note that the first direction and the second direction are not always necessarily orthogonal to each other, since the semiconductor memory device 1 may contain some variations during manufacturing.

As illustrated in FIGS. 1A and 1B, the semiconductor memory device 1 has, on a substrate SB, a peripheral circuit CUA, memory regions MR, through-contact regions TP, and staircase regions SR.

The substrate SB is typically a semiconductor substrate such as a silicon substrate. The substrate SB has, arranged thereon, the peripheral circuit CUA that contains a transistor TR, wirings and so forth. The peripheral circuit CUA contributes to an operation of a memory cell described later.

The peripheral circuit CUA is covered with an insulating layer 50. On the insulating layer 50, a source line SL is arranged. Above the source line SL, a plurality of word lines WL is stacked. The plurality of word lines WL is covered with an insulating layer 51. The insulating layer 51 also extends to the circumference of the plurality of word lines WL.

To the plurality of word lines WL, there is arranged plurality of plate-like contacts LI that extends through the word line WL in the stacking direction, and extends in a direction along the X-direction. Hence, the plurality of word lines WL is divided in the Y-direction by the plurality of plate-like contacts LI.

Between every adjacent ones of the plurality of plate-like contacts LI, there are arranged plurality of memory regions MR, staircase regions SR, and through-contact regions TP, while being juxtaposed in the X-direction. The plurality of memory regions MR is arranged away from each other in the X-direction, while placing the staircase region SR and the through-contact region TP in between.

In the memory region MR, a plurality of pillars PL is arranged so as to extend through the word lines WL in the stacking direction. Plurality of memory cells is formed at intersection of the pillars PL and the word lines WL. Hence, the semiconductor memory device 1 is typically built as a three-dimensional nonvolatile memory in which the memory cells are three-dimensionally arranged in each memory region MR.

The staircase region SR contains a plurality of steps SP in which the plurality of word lines WL is terraced downwards in the stacking direction, so as to give a bowl-like profile. In one staircase region SR, two steps SP are juxtaposed in the Y-direction while placing one plate-like contact LI in between.

Each step SP forms one side of the bowl-like profile that is terraced down towards the bottom, from both sides in the X-direction and from one side in the Y-direction. The step SP on the other side in the Y-direction is opened towards the side face of the plate-like contact LI.

Each stair of the step SP is formed of the word line WL of each tier. The word lines WL of the individual tiers establish electrical conduction on both sides in the X-direction while placing the staircase region SR in between, through a step part on one side in the Y-direction of the step SP. A contact CC that connects the word line WL of each tier and the upper wiring MX is arranged on a terrace part of each stair of the step SP.

This enables leading-out of the individual word lines WL that are stacked in multiple layers. Through these contacts CC, write voltage, read voltage, and so forth are applied to the memory cells in the memory regions MR that are arranged on both sides in the X-direction, by way of the word lines WL which are laid at the same level of height with the memory cells.

In the present specification, a direction in which the terrace faces of the individual stairs of the step SP are directed is specified as upward direction.

On one side in the X-direction of the staircase region SR, there is arranged the through-contact region TP. In the through-contact region TP, a through-contact C4 that extends through the plurality of word lines WL is arranged. The through-contact C4 connects the peripheral circuit CUA arranged on the substrate SB on the lower side, with the upper wiring MX connected to the contact CC in the step SP. Various types of voltage applied through the contacts CC to the memory cells are controlled by the peripheral circuit CUA, typically by way of the through-contact C4, and the upper wiring MX.

Next, a detailed exemplary structure of the semiconductor memory device 1 will be described with reference to FIGS. 2A to 2D. FIGS. 2A to 2D are cross-sectional views illustrating the semiconductor memory device 1 according to the first embodiment.

Figure 2A:
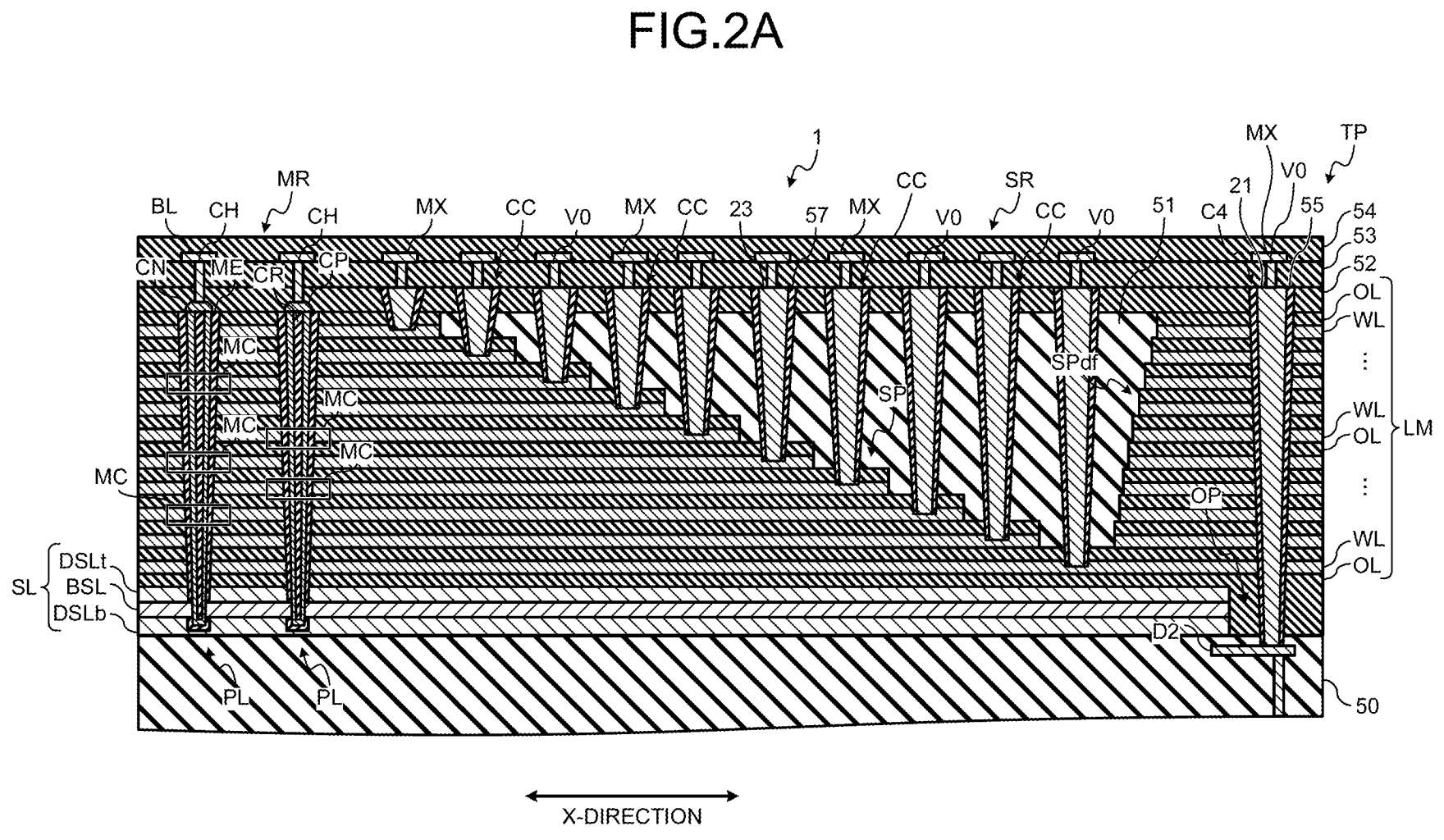
Figures 2B, 2C, 2D:
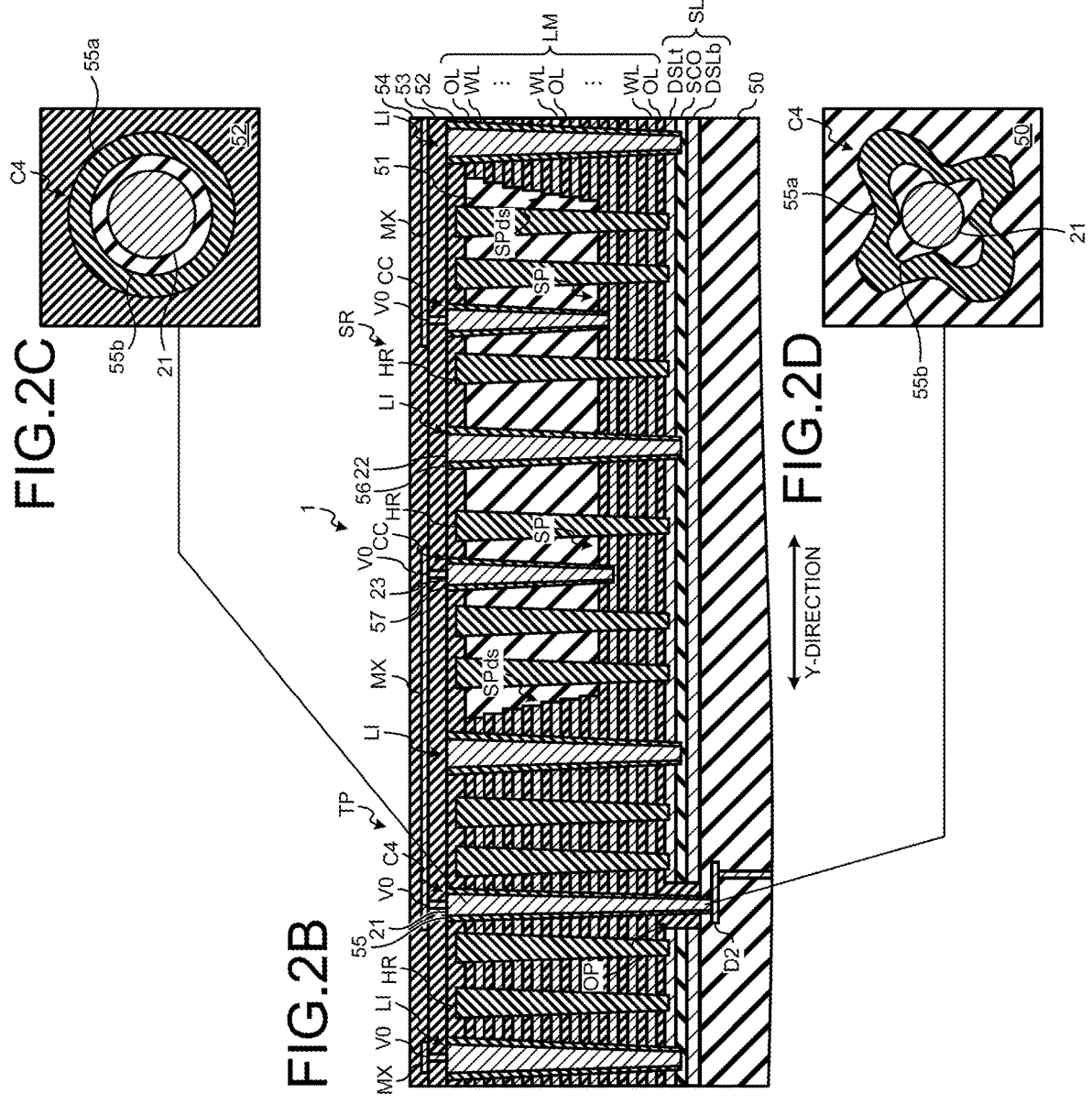

FIG. 2A is a cross-sectional view taken along the X-direction, including the memory region MR, the staircase region SR and the through-contact region TP. FIG. 2B is a cross-sectional view taken along the Y-direction, including the staircase region SR and the through-contact region TP. Note that FIGS. 2A and 2B do not illustrate the substrate SB, and a structure such as the peripheral circuit CUA in a lower part of the insulating layer 50, and so forth.

FIGS. 2C and 2D are cross-sectional views taken along the XY-plane of the through-contact C4, wherein FIG. 2C illustrates a cross section of the through-contact C4 taken at or around the upper end in the stacking direction of the stacked body LM, and FIG. 2D illustrates a cross section taken at or around the lower end.

As illustrated in FIGS. 2A and 2B, the source line SL has a multilayer structure in which, for example, a bottom source line DSLb, an intermediate source line BSL, and a top source line DSLt are stacked in this order on the insulating layer 50. The bottom source line DSLb, intermediate source line BSL, and the top source line DSLt are typically formed of a polysilicon layer. Among them, at least the intermediate source line BSL may be typically formed of a conductive polysilicon layer in which an impurity is diffused. Note that at the position below the stacked body LM except the memory region MR, the source line SL may have an intermediate insulating layer SCO such as a silicon oxide layer instead of an intermediate source line BSL.

Above the source line SL, there is arranged the stacked body LM. In the stacked body LM, the plurality of word lines WL and the plurality of insulating layers OL are alternatively stacked one by one. The plurality of word lines WL that represents the plurality of conductive layers is typically tungsten layers or molybdenum layers. The plurality of insulating layers OL is typically silicon oxide layers.

The number of stacking of the word line WL in the stacked body LM is freely selectable. The stacked body LM may have one or more select gate lines, which represent conductive layer, further above the uppermost word line WL. Through these select gate lines, an isolation layer typically formed of an insulating layer extends, thereby dividing these select gate lines into a plurality of regions. The stacked body LM may have one or more select gate lines, which represent conductive layer, further below the lowermost word line WL.

The top face of the stacked body LM is covered with an insulating layer 52. The insulating layer 52 is covered with an insulating layer 53. The insulating layer 53 is covered with an insulating layer 54.

As illustrated in FIG. 2B, the stacked body LM is divided in the Y-direction by the plurality of plate-like contacts LI.

The individual plate-like contacts LI are juxtaposed in the Y-direction, and each extends in the stacking direction of the stacked body LM and in a direction along the X-direction. That is, each plate-like contact LI extends through the insulating layer 52, the stacked body LM, and the top source line DSLt to reach the intermediate source line BSL or the intermediate insulating layer SCO. The plate-like contact LI also continuously extends in the stacked body LM, over a range between both ends in the X-direction of the stacked body LM including the memory regions MR.

Each plate-like contact LI includes an insulating layer 56 and a conductive layer 22. The insulating layer 56 is typically a silicon oxide layer. The conductive layer 22 is typically a tungsten layer or a conductive polysilicon layer.

The insulating layer 56 covers the plate-like contact LI on the sidewalls thereof opposed in the Y-direction. The conductive layer 22 is filled inside the insulating layer 56, and electrically connected to the source line SL that contains the intermediate source line BSL. The conductive layer 22 is also connected to the upper wiring MX arranged in the insulating layer 54, through a plug V0 arranged in the insulating layer 53. With such structure, the plate-like contact LI can function as a source line contact.

The stacked body LM may alternatively be divided in the Y-direction, by a plate-like portion typically formed of the insulating layer 56, without having the conductive layer 22. The plate-like portion in this case does not function as a source line contact.

As illustrated in FIG. 2A, the plurality of pillars PL is arranged in a distributed manner in the memory region MR.

The plurality of pillars PL is typically arranged according to a staggered pattern when viewed in the stacking direction of the stacked body LM. Each pillar PL typically has a circular, elliptic, or oval cross section, as a cross section in the direction the layers of the stacked body LM spread, that is, in the direction along the XY-plane.

Each of the plurality of pillars PL has a memory layer ME that extends in the stacked body LM in the stacking direction, and a channel layer CN that extends through the stacked body LM and connects with the intermediate source line BSL.

As described later, the memory layer ME has a multi-layered structure in which a block insulating layer, a charge storage layer, and a tunnel insulating layer are stacked in this order, when viewed from the outer circumferential side of the pillar PL. More specifically, the memory layer ME is arranged over the side face of the pillar PL, except at a level of depth where the intermediate source line BSL lies. The memory layer ME is also arranged on the bottom face of the pillar PL that reaches the level of depth where the bottom source line DSLb lies.

The channel layer CN extends through the stacked body LM, the top source line DSLt, and the intermediate source line BSL, inside the memory layer ME, to reach the bottom source line DSLb. The channel layer CN contacts, on the side face thereof, with the intermediate source line BSL, thereby being electrically connected with the source line SL that contains the intermediate source line BSL. Further inside the channel layer CN, there is filled a core layer CR.

Each of the plurality of pillars PL has a cap layer CP at the upper end. The cap layer CP is arranged in the insulating layer 52 so as to cover at least the upper end of the channel layer CN, and is connected to the channel layer CN. The cap layer CP is connected through a plug CH that is arranged in the insulating layers 52 and 53, to a bit line BL that is arranged in the insulating layer 54.

The block insulating layer and the tunnel insulating layer in the memory layer ME, and the core layer CR are typically formed of a silicon oxide layer. The charge storage layer in the memory layer ME is typically formed of a silicon nitride layer. The channel layer CN and the cap layer CP are typically formed of a semiconductor layer such as a poly-silicon layer or an amorphous silicon layer.

With such structure, a memory cell MC is formed at each part where the side face of the pillar PL opposes with each word line WL. Upon application of a predetermined level of voltage through the word line WL, data is read or written from or to the memory cell MC.

In a case where the stacked body LM has a select gate line arranged above or below the word line WL, a select gate is formed at a part where the side face of the pillar PL opposes with the select gate line. Upon application of a predeter-mined level of voltage through the select gate line, the select gate turns on or off, so as to have the memory cell MC on the pillar PL to which the select gate belongs being selection state or un-selection state.

As illustrated in FIGS. 2A and 2B, the staircase region SR has arranged therein the steps SP, SPdf and SPds. Each of the steps SP, SPdf and SPds has a shape such that the plurality of word lines WL and the plurality of insulating layers OL are terraced.

Among these steps SP, SPdf and SPds, the step SP functions to electrically lead out the plurality of word lines WL to the upper wiring MX. The other steps SPdf and SPds are dummy steps that do not contribute to the function of the semiconductor memory device 1.

The step SP extends in the X-direction at a point close to the memory region MR, and is terraced downwards in the direction departing from the memory region MR. The step SPdf extends in the X-direction while being opposed with the step SP at a point close to the through-contact region TP, and is terraced downwards in the direction approaching the step SP.

The step SPds is arranged between the steps SP and SPdf, near the plate-like contact LI on one side in the Y-direction of the steps SP and SPdf. The step SPds extends in the Y-direction while being opposed with the plate-like contact LI on the other side neighboring in the Y-direction, and terraced downwards in the direction approaching the plate-like contact LI on the other side.

Now, each of the steps SPdf and SPds has terraces on the individual stairs shorter than the terraces of the step SP. Hence, each of the steps SPdf and SPds has a profile steeper than in the step SP, and has a step length, that is, the length from the uppermost stair to the lowermost stair, shorter than in the step SP.

With the steps SP, SPdf and SPds thus arranged, the stacked body LM has a recessed profile like a bowl in the staircase region SR. In the bowl-like region, the insulating layer 51 such as a silicon oxide layer is arranged so as to cover the top faces of the step SP, SPdf and SPds. The aforementioned insulating layers 52 to 54 also cover the top face of the insulating layer 51.

FIG. 2B illustrates a cross section of the third stair from the lowermost stair of the step SP. That is, FIG. 2B illustrates a part where the insulating layer OL just above the third word line WL from the word line WL in the lowermost layer appears as the terrace face. As seen in FIG. 2B, there are steps SP individually arranged on both sides in the Y-direction of the plate-like contact LI that is illustrated at the center of the staircase region SR. On one side in the Y-direction of the other plate-like contact LI in the staircase region SR, there is arranged the step SPds.

To the word line WL that composes each stair of the step SP, there is connected the contact CC that extends through the insulating layers 52 and 51, and through the insulating layers OL that compose the terrace faces of the individual stairs. The contact CC has an insulating layer 57 that covers the outer circumference of the contact CC, and a conductive layer 23 such as a tungsten layer or a copper layer filled inside the insulating layer 57. The conductive layer 23 is connected to the upper wiring MX arranged in the insulating layer 54, through the plug V0 arranged in the insulating layer 53. This structure enables electrical leading-out of the individual word lines WL in the individual stairs.

In the staircase region SR that contains the steps SP, SPdf and SPds, there are arranged a plurality of columnar portions HR.

The plurality of columnar portions HR is arranged according to a staggered pattern or grid-like pattern, while avoiding interference with the contact CC. Each columnar portion HR typically has a circular, elliptic, or oval cross section, as a cross section in the direction along the XY-plane.

Each of the plurality of columnar portions HR extends in the stacked body LM in the stacking direction, and typically reaches the top source line DSLt, from among the bottom source line DSLb, an intermediate insulating layer SCO, and the top source line DSLt. The columnar portion HR is typically formed of an insulating layer such as a silicon oxide layer, and does not contribute to the function of the semiconductor memory device 1. The columnar portion HR takes part in supporting a structure created when the stacked body LM is formed from a stacked body having sacrificial layers and the insulating layers stacked therein as described later.

The plurality of columnar portions HR is also arranged in a distributed manner in the through-contact region TP described below, while avoiding interference with the through-contact C4.

The dummy steps may also be arranged at both ends in the X-direction and both ends in the Y-direction of the stacked body LM, similarly to the above-described steps SPdf and SPds. The aforementioned plurality of columnar portions HR may be arranged in a distributed manner in these dummy steps.

As illustrated in FIGS. 2A and 2B, through-contacts C4 are arranged in the through-contact region TP.

In the through-contact region TP, the plurality of through-contacts C4 is typically arranged in a direction along the X-direction (see FIG. 1A). The plurality of through-contacts C4 may, however, be arranged in the through-contact region TP in the Y-direction, in place of, or in addition to the X-direction.

Each through-contact C4 extends through the insulating layer 52 and the stacked body LM, and typically through an opening OP provided in the source line SL, to reach the insulating layer 50 that covers the peripheral circuit CUA (see FIG. 1A). The through-contact C4 connects structures that are arranged above and below the stacked body LM.

Each through-contact C4 has an insulating layer 55 that covers the outer circumference of the through-contact C4, and a conductive layer 21 that is filled inside the insulating layer 55 and is typically formed of a tungsten layer or a copper layer. The conductive layer 21 extends in the through-contact C4 in the stacking direction of the stacked body LM, at a point that contains a center part of the through-contact C4 when viewed in a cross section taken in a direction along the XY-plane. That is, the conductive layer 21 serves as a core of the through-contact C4. The insulating layer 55 corresponds to a liner that covers the outer circumferential face of the conductive layer 21.

The conductive layer 21 is connected, above the stacked body LM, to the upper wiring MX arranged in the insulating layer 54, through the plug V0 arranged in the insulating layer 53. As described previously, the upper wiring MX is typically connected to the contact CC of the step SP juxtaposed in the Y-direction while placing the plate-like contact LI in between. The conductive layer 21 is also connected, below the stacked body LM, to the peripheral circuit CUA, through a lower wiring D2 arranged in the insulating layer 50.

Upon application of a predetermined level of voltage, in this structure, from the peripheral circuit CUA to the memory cell MC typically through the through-contact C4, the contact CC, and the word line WL, the memory cell MC can operate as a memory element. The through-contact C4, having therein the insulating layer 55, is prevented from short-circuiting with the word line WL and so forth, even if arranged for example in the stacked body LM.

As illustrated in FIGS. 2C and 2D, the insulating layer 55 in the through-contact C4 includes a plurality of insulating layers 55a and 55b.

The insulating layer 55a is arranged on the outer circumferential side of the through-contact C4, while containing a part that corresponds to the outer edge of the insulating layer 55. The insulating layer 55b is in contact with the outer edge of the conductive layer 21, and is arranged on the inner side of the through-contact C4 than the insulating layer 55a. The insulating layers 55a and 55b continuously cover the circumference of the conductive layer 21. The insulating layer 55b may alternatively cover the circumference of the conductive layer 21 intermittently, or discontinuously.

Both of the insulating layers 55a and 55b are typically formed of a silicon oxide layer. Crystals contained in the insulating layer 55b may have an average grain diameter, typically larger than an average grain diameter of crystals contained in the insulating layer 55a. That is, the insulating layer 55b may have higher crystallinity than the insulating layer 55a.

At the upper end of the through-contact C4 connected to the plug V0, the outer circumferential faces of the insulating layers 55a and 55b and the conductive layer 21 have a relatively smooth profile. In the present application, "smooth" is defined as fewer rough parts, fewer lumps, or fewer unevenness. The outer circumferential faces of the insulating layers 55a and 55b and the conductive layer 21 may have a substantially equal roughness. Alternatively, the outer circumferential face of the conductive layer 21 may be smoother than that of the insulating layer 55b, and the outer circumferential face of the insulating layer 55b may be smoother than that of the insulating layer 55a. That is, the roughness in this case decreases in the order of the insulating layer 55a, the insulating layer 55b, and the conductive layer 21.

Hence, at the upper end in the stacking direction of the stacked body LM, each through-contact C4 has a nearly circular, elliptic, or oval cross section, as a cross section in a direction along the XY-plane.

In the upper end of the through-contact C4, variation in distance between the center point of the conductive layer 21 and the outer edge of the insulating layer 55a is relatively small, when measured in a cross section along the XY-plane, and compared at a plurality of points in the circumferential direction of the through-contact C4.

Similarly, regarding the distance measured from the center point in the cross section of the conductive layer 21 to the outer edge of the insulating layer 55b, and to the outer edge of the conductive layer 21, and compared at a plurality of points in the circumferential direction of the through-contact C4, a variation in the distance regarding the insulating layer 55a, a variation in the distance regarding the insulating layer 55b, and a variation in the distance in the conductive layer 21 may be equivalent to each other. Alternatively, the variation may be reduced in decreasing order of the variation in the distance regarding the insulating layer 55a, in the distance regarding the insulating layer 55b, and in the distance regarding the conductive layer 21. This relationship may be the same in any case where each of the through-contacts C4 has any of cross-sectional shapes such as circle, ellipse, or oval.

On the other hand, at the lower end of the through-contact C4 connected to the lower wiring D2, the outer circumferential faces of the insulating layers 55a and 55b are not smooth, instead typically having an irregular profile. Hence, the roughness of the insulating layers 55a and 55b at the lower ends thereof are respectively higher than those at the upper ends. That is, the roughness of the insulating layers 55a and 55b decreases from the lower end towards the upper end of the through-contact C4.

At the lower end of the through-contact C4, the outer circumferential faces of the insulating layers 55a and 55b may have nearly equal roughness. Alternatively, the outer circumferential face of the insulating layer 55b may have the roughness lower than that of the outer circumferential face of the insulating layer 55a.

The outer circumferential face of the conductive layer 21 has a relatively smooth profile also at the lower end of the through-contact C4. Hence, at the lower end of the through-contact C4, the roughness of the outer circumferential face of the conductive layer 21 is lower than the roughness of the outer circumferential faces of the insulating layers 55a and 55b.

The outer circumferential face of the conductive layer 21 may have nearly equal roughness at the upper and lower ends of the through-contact C4. Alternatively, the outer circumferential face of the conductive layer 21 may have the roughness that decreases from the lower end toward the upper end of the through-contact C4.

As described previously, since the outer circumferential faces of the insulating layers 55a and 55b have irregularities, so that each through-contact C4 has, at the lower end in the stacking direction of the stacked body LM, a cross-sectional shape taken in a direction along the XY-plane, which is distorted from circle, ellipse or oval according to the shape at the upper end of the through-contact C4.

In the lower end of the through-contact C4, the variation in the distance between the center point of the conductive layer 21 and the outer edge of the insulating layer 55a is typically larger than the variation at the upper end of the through-contact C4, when measured in a cross section along the XY-plane, and compared at a plurality of points in the circumferential direction of the through-contact C4.

Similarly, regarding the distance measured from the center point in the cross section of the conductive layer 21 to the outer edge of the insulating layer 55b, and compared at a plurality of points in the circumferential direction of the through-contact C4, the variation in the distance is typically larger in the lower end of the through-contact C4 than the variation at the upper end of the through-contact C4.

When measuring the distance from the center point in the cross section of the conductive layer 21 to the outer edge of the conductive layer 21, and comparing the distance at a plurality of points in the circumferential direction of the through-contact C4, the variation in the distance remains relatively small. Hence at the lower end of the through-contact C4, the variations in the distance regarding the insulating layers 55a and 55b are larger than the variation in the distance regarding the conductive layer 21. This relationship may be the same in any case where each of the through-contacts C4 has any of cross-sectional shapes such as circle, ellipse, or oval.

The variation in the distance regarding the conductive layer 21 may be nearly equal both at the upper and lower ends of the through-contact C4. Alternatively, the variation in the distance regarding the conductive layer 21 may decrease from the lower end towards the upper end of the through-contact C4.

At the lower end of the through-contact C4, the variation in the distance regarding the insulating layer 55a may be equivalent to the variation in the distance regarding the insulating layer 55b. Alternatively, the variation in the distance regarding the insulating layer 55b may be smaller than the variation in the distance regarding the insulating layer 55a.

The exemplary structure of the through-contact C4 has been detailed. Note that the insulating layer 55 may only contain both of the insulating layers 55a and 55b at least at around the lower end of the through-contact C4, and not always necessarily contain the insulating layer 55b at the upper end of the through-contact C4.

(Method for Manufacturing Semiconductor Memory Device)

Next, a method for manufacturing the semiconductor memory device 1 according to the first embodiment will be explained, referring to FIGS. 3A to 12K. FIGS. 3A to 12K are drawings sequentially illustrating a part of exemplary procedures of the method for manufacturing the semiconductor memory device 1 according to the first embodiment. Note that the processes illustrated in FIGS. 3A to 12K are preceded by formation of the peripheral circuit CUA on the substrate SB, and formation of the insulating layer 50 that covers the peripheral circuit CUA.

First, events during formation of the step SP are illustrated in FIGS. 3A to 4B. FIGS. 3A to 4B illustrate cross sections, taken along the Y-direction, of a region that is later processed into the staircase region SR.

Figure 3A:
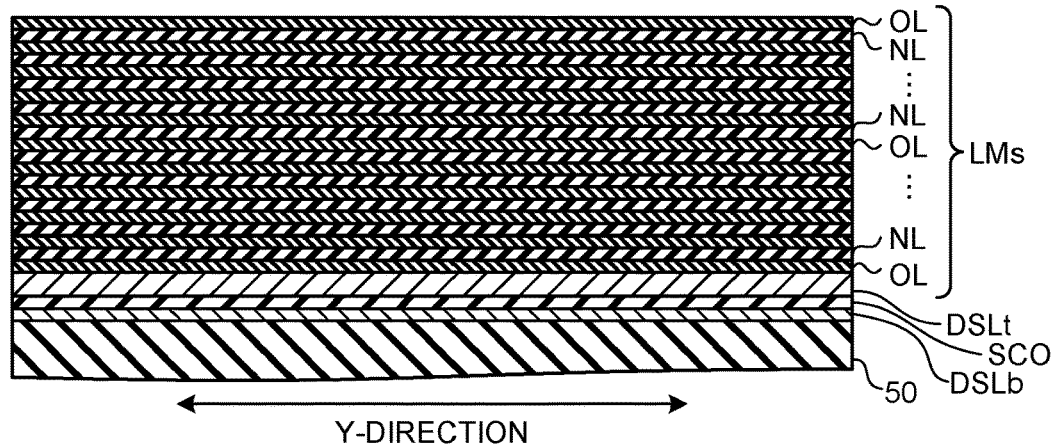
FIGS. 3A to 3C are drawings sequentially illustrating a part of exemplary procedures of a method for manufacturing the semiconductor memory device according to the first embodiment.

As illustrated in FIG. 3A, the bottom source line DSLb, the intermediate insulating layer SCO, and the top source line DSLt are formed in this order on the insulating layer 50.

Above the top source line DSLt, a plurality of insulating layers NL and a plurality of insulating layers OL are alternately stacked one by one, to form a stacked body LMs. The insulating layer NL is typically formed of a silicon nitride layer, and functions as a sacrificial layer that is later replaced with a conductive material which becomes the word line WL.

Figure 3B:
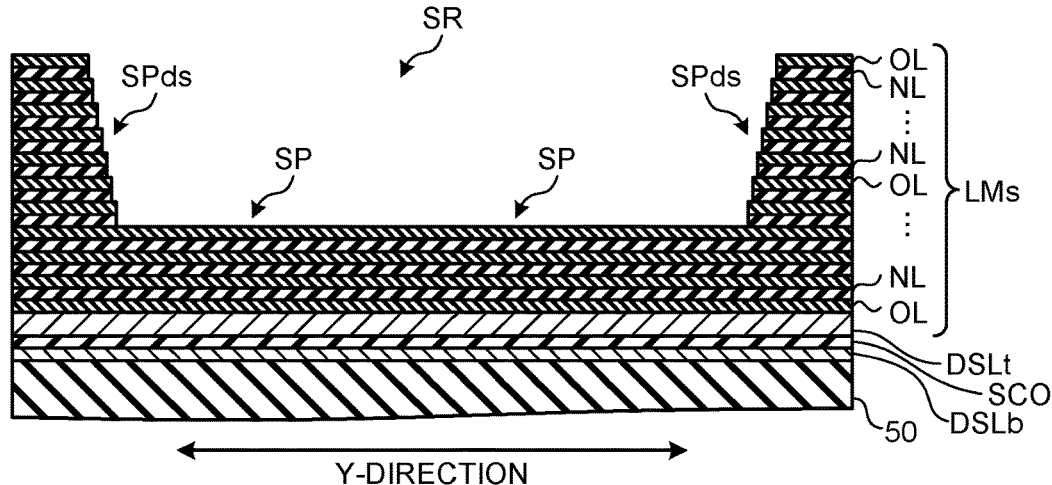

As illustrated in FIG. 3B, in a partial region of the stacked body LMs, the insulating layer NL and the insulating layer OL are terraced downwards to form the step SP. The step SP is formed by slimming a mask pattern such as a photoresist layer, and by etching the insulating layer NL and the insulating layer OL that compose the stacked body LMs, which are repeated multiple times.

That is, a mask pattern having an opening at a site where the step SP will be formed is formed on the top face of the stacked body LMs, and typically the insulating layer NL and the insulating layer OL are etched off one by one. The opening edge of the mask pattern is then set back typically by oxygen plasma treatment to widen the opening, and the insulating layer NL and the insulating layer OL are again etched off one by one. By repeating such processes multiple times, the insulating layer NL and the insulating layer OL are terraced downwards in the opening of the mask pattern.

The mask pattern is newly re-formed after repeating the aforementioned processes a predetermined number of times, so that the mask pattern can keep the thickness at a predetermine level or above. In this process, the relatively moderately sloping step SP and the steep dummy steps SPdf and SPds may be formed by properly adjusting position of the opening edge of the mask pattern. Similarly, by properly adjusting the end positions of the mask pattern at both ends in the X-direction and both ends in the Y-direction of the stacked body LMs, the steep dummy steps, like the dummy steps SPdf and SPds, are individually formed at four ends of the stacked body LMs.

FIG. 3B is a cross-sectional view illustrating the third stair from the lowermost stair of the thus formed step SP. The cross section illustrated in FIG. 3B will be divided into two steps SP, by the plate-like contact LI formed later. On one side in the Y-direction of the stacked body LMs in each step SP, there is formed the step SPds.

Figure 3C:
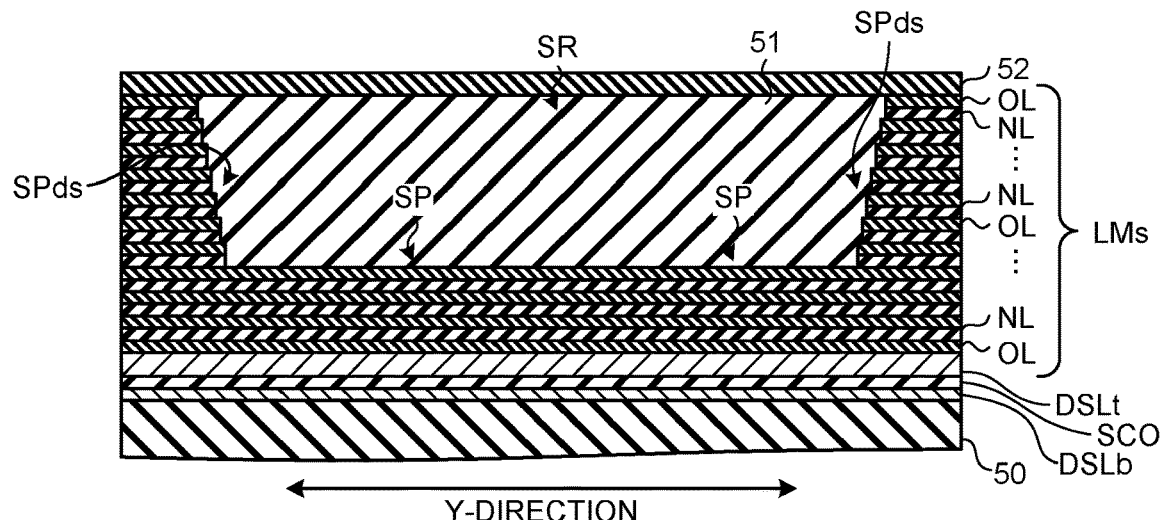

As illustrated in FIG. 3C, the insulating layer 51 typically formed of a silicon oxide layer is formed so as to cover the step SP, and to reach the level of height of the top face of the stacked body LMs. That is, the insulating layer 51 is formed in a bowl-like region that is surrounded by the steps SP, SPds, and SPdf. The insulating layer 51 is also formed in a circumferential region of the stacked body LMs that has the steps at each of four ends. The insulating layer 52 is further formed so as to cover the top face of the stacked body LMs, and the top face of the insulating layer 51.

Figure 4A:
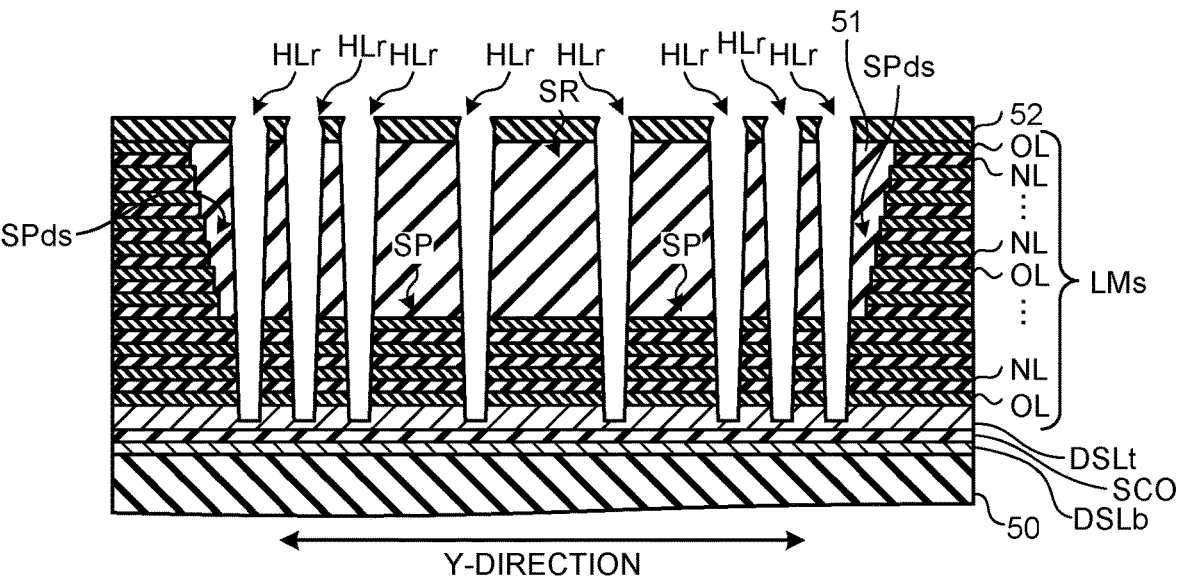
FIGS. 4A and 4B are drawings sequentially illustrating the part of exemplary procedures of the method for manufacturing the semiconductor memory device according to the first embodiment.

As illustrated in FIG. 4A, in a bowl-like region that is surrounded by the steps SP, SPds and SPdf, a plurality of holes HL is formed so as to extend through the insulating layers 52 and 51 and the stacked body LMs, and to typically reach the top source line DSLt, from among the bottom source line DSLb, the intermediate insulating layer SCO, and the top source line DSLt.

Figure 4B:
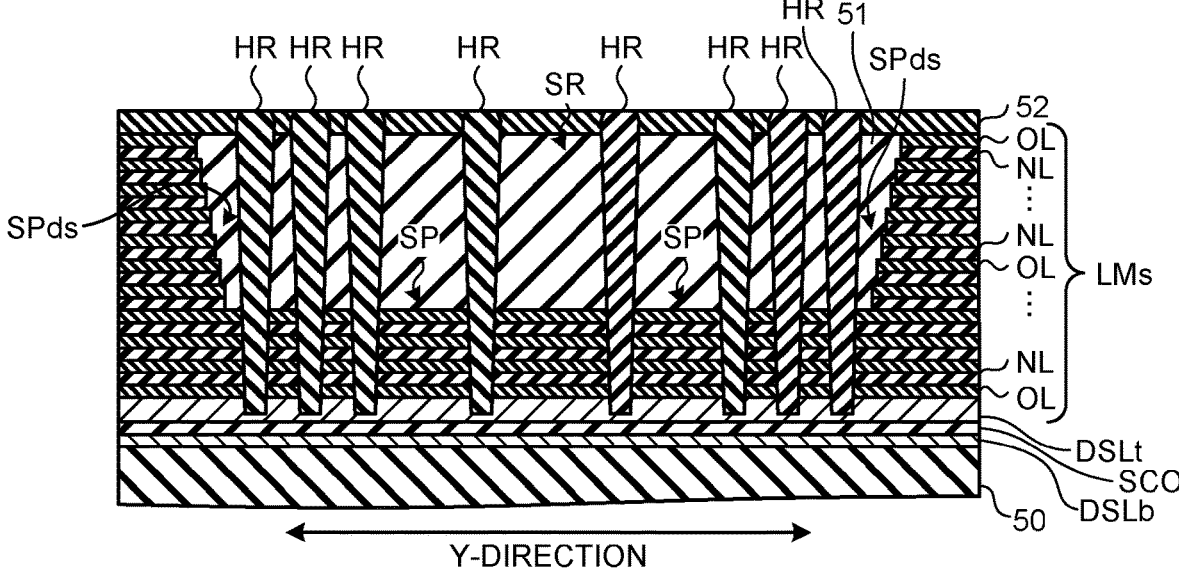

As illustrated in FIG. 4B, the hole HL is filled with an insulating layer such as a silicon oxide layer, whereby a plurality of columnar portions HR is formed.

Next, FIGS. 5A to 6C illustrate events during formation of the pillars PL.

FIGS. 5A to 6C illustrate cross sections taken along the Y-direction of a region that will later become the memory region MR. Note that the pillars PL, each typically having a circular, elliptic, or oval shape, will give similar cross-sectional shape irrespective of directionality of the cross section.

Figures 5A, 5B, 5C:
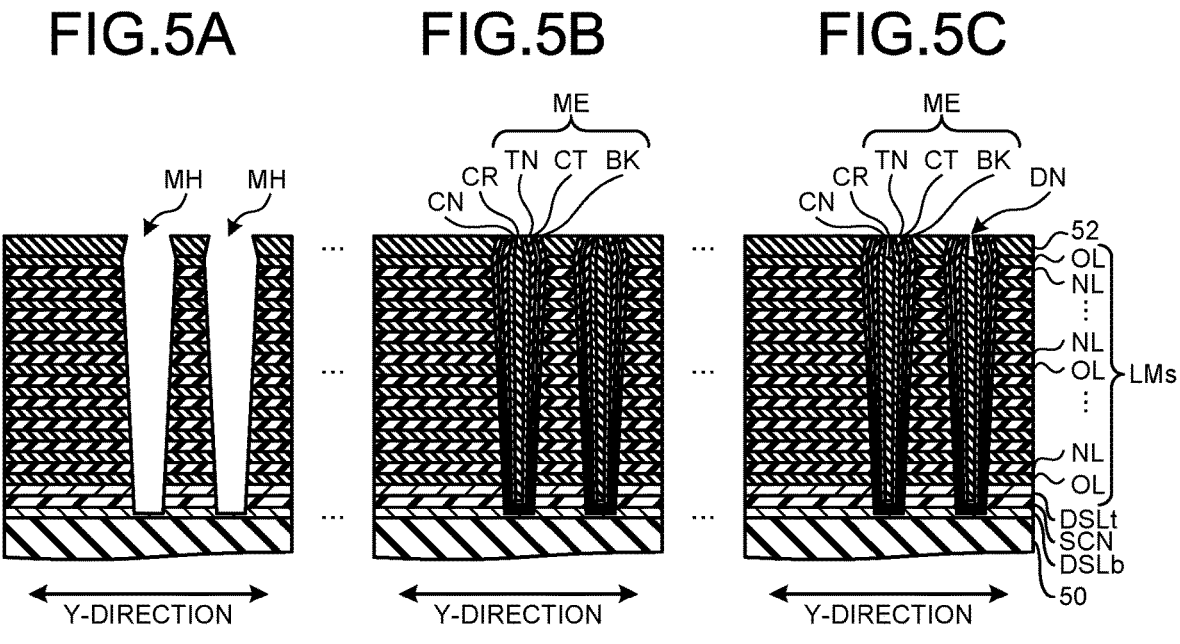
FIGS. 5A to 5C are drawings sequentially illustrating the part of exemplary procedures of the method for manufacturing the semiconductor memory device according to the first embodiment.

As illustrated in FIG. 5A, also in the region where the memory region MR will be formed later, the stacked body LMs has been formed above the top source line DSLt, and the insulating layer 52 has been formed on the stacked body LMs, as a result of the aforementioned processes. Note that at the lower position in the memory region MR, an intermediate insulating layer SCN is formed instead of the intermediate insulating layer SCO. The intermediate insulating layer SCN is typically formed of a silicon nitride layer, and functions as a sacrificial layer that is later replaced for example with a conductive polysilicon layer which becomes the intermediate source line BSL. In this structure, a plurality of memory holes MH is formed so as to extend through the insulating layer 52 and the stacked body LMs, and to reach the bottom source line DSLb.

As illustrated in FIG. 5B, in each memory hole MH, there is formed a memory layer ME in which a block insulating layer BK, a charge storage layer CT, and a tunnel insulating layer TN are stacked in this order when viewed from the outer circumferential side of the memory hole MH. As described previously, the block insulating layer BK and the tunnel insulating layer TN are typically formed of a silicon oxide layer, and the charge storage layer CT is typically formed of a silicon nitride layer.

The memory layer ME is also formed on the bottom face of the memory hole MH that reaches the bottom source line DSLb.

Inside the tunnel insulating layer TN, there is formed a channel layer CN typically formed of a polysilicon layer or an amorphous silicon layer. Further inside the channel layer CN, there is filled a core layer CR typically formed of a silicon oxide layer.

As illustrated in FIG. 5C, the core layer CR exposed on the top face of the insulating layer 52 is etched off to a predetermined depth, to form a recess DN.

Figures 6A, 6B, 6C:
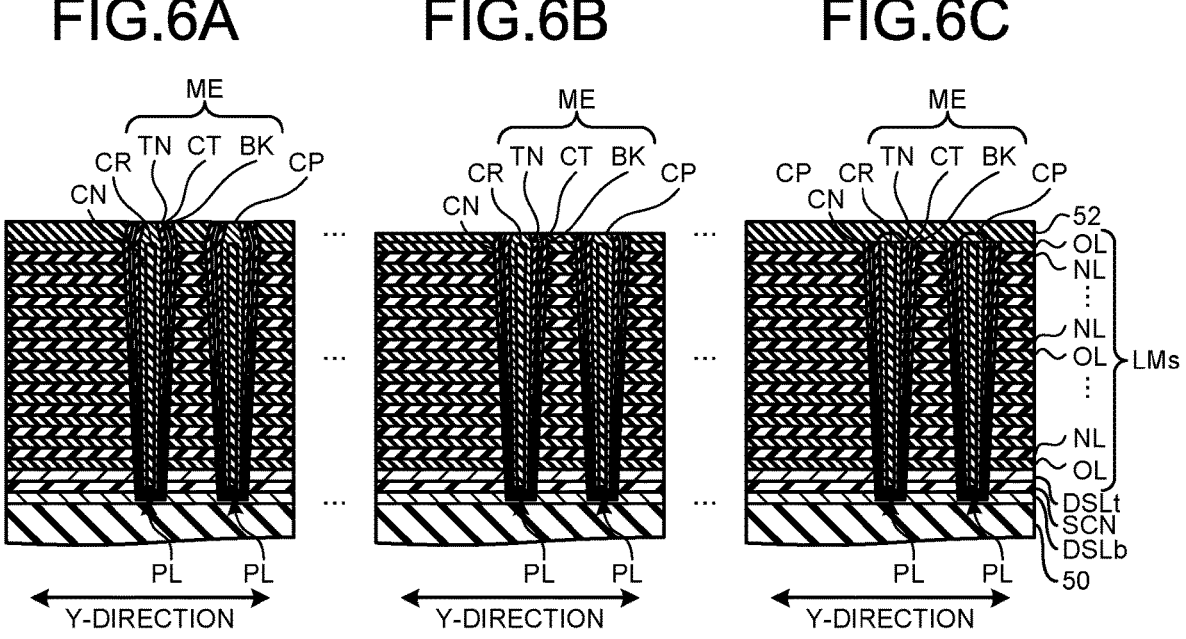
FIGS. 6A to 6C are drawings sequentially illustrating the part of exemplary procedures of the method for manufacturing the semiconductor memory device according to the first embodiment.

As illustrated in FIG. 6A, the inside of the recess DN is filled typically with a polysilicon layer or an amorphous silicon layer, to form a cap layer CP. The plurality of pillars PL is thus formed. Note that the channel layer CN at this stage is entirely covered with the memory layer ME, and is not connected yet to the intermediate insulating layer SCN which will later be turned into the intermediate source line BSL.

As illustrated in FIG. 6B, the insulating layer 52 is etched back together with the top face of the cap layer CP. The cap layer CP is thus thinned.

As illustrated in FIG. 6C, the insulating layer 52 having been thinned by etch-back is supplemented. The top face of the cap layer CP is thus covered with the insulating layer 52.

Note that the order of the process for forming the step SP in FIGS. 3B and 3C, the process for forming the columnar portions HR in FIGS. 4A and 4B, and the process for forming the pillars PL in FIGS. 5A to 6C are interchangeable with each other.

Next, FIGS. 7Aa to 9Bd illustrate events during replacement of the intermediate insulating layer SCN, and formation of the insulating layer 55 of the through-contact C4.

Figures 7C, 7D:
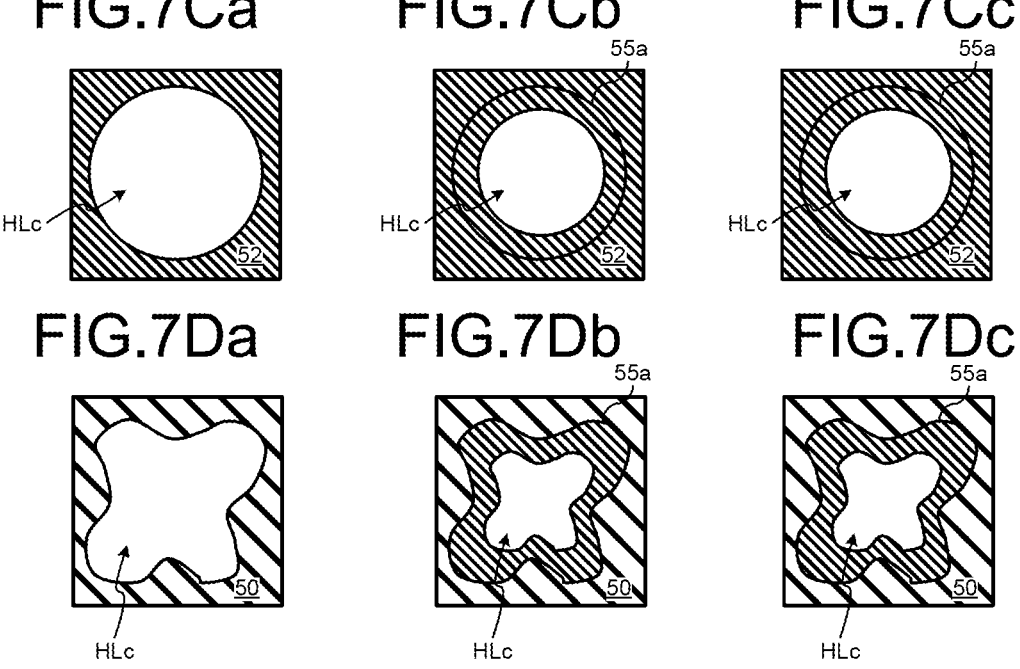
FIGS. 7Aa to 7Dc are drawings sequentially illustrating the part of exemplary procedures of the method for manufacturing the semiconductor memory device according to the first embodiment.

FIGS. 7Aa to 7Ac illustrate cross sections taken along the Y-direction of a region that will later become the memory region MR, similarly to FIGS. 5A to 6B. FIGS. 7Ba to 7Bc illustrate cross sections taken along the Y-direction of a region that will later become the through-contact region TP. FIGS. 7Ca to 7Dc are cross sections taken along the XY-plane of a part which will later become the through-contact C4, wherein FIGS. 7Ca to 7Cc illustrate cross sections near the upper end of the through-contact C4, and FIGS. 7Da to 7Dc illustrate cross sections near the lower end of the through-contact C4.

As illustrated in FIG. 7Aa, a slit ST is formed so as to extend through the insulating layers 52, the stacked body LMs, and the top source line DSLt, and to reach the intermediate insulating layer SCN. The slit ST also extends in a direction along the X-direction in the stacked body LMs.

As illustrated in FIG. 7Ab, an insulating layer 56s is formed on sidewalls, opposed in the Y-direction, of the slit ST.

A removal liquid for the intermediate insulating layer SCN, such as hot phosphoric acid, is injected through the slit ST with the sidewalls thus protected with the insulating layer 56s, and the intermediate insulating layer SCN sandwiched between the bottom source line DSLb and the top source line DSLt is removed.

This consequently forms a gap layer GPs between the bottom source line DSLb and the top source line DSLt. In addition, a part of the memory layer ME at the outer circumference of the pillar PL exposes in the gap layer GPs. Note that the insulating layer NL in the stacked body LMs is prevented from being removed, since the sidewalls of the slit ST in this state are protected with the insulating layer 56s.

As illustrated in FIG. 7Ac, a chemical liquid is properly injected through the slit ST into the gap layer GPs, to sequentially remove the block insulating layer BK, the charge storage layer CT, and the tunnel insulating layer TN exposed in the gap layer GPs. A part of the channel layer CN inside the memory layer ME is thus exposed in the gap layer GPs.

As illustrated in FIG. 7Ba, also in a region which will later become the through-contact region TP, the aforementioned process illustrated in FIG. 4B, and the subsequent processes having been illustrated in FIGS. 5A to 6C have resulted in etch-back of the upper end of the columnar portion HR, supplementation of the insulating layer 52, and coverage of the top face of the columnar portion HR with the insulating layer 52.

Also in a region which will later become the through-contact region TP, the slit ST is formed parallelly with the process illustrated in FIG. 7Aa. Parallelly with formation of the slit ST, a contact hole HLc is formed so as to extend through the insulating layer 52 and the stacked body LMs, to pass across the opening OP provided in the top source line DSLt, the intermediate insulating layer SCO, and the bottom source line DSLb, and to reach the lower wiring D2 in the insulating layer 50.

As illustrated in FIG. 7Ca, the contact hole HLc typically has a substantially circular cross-sectional shape at the upper end. The contact hole HLc may alternatively have, for example, an elliptic or oval cross-sectional shape, as described previously.

Now, the contact hole HLc is processed parallelly with the slit ST, typically under conditions suitable, for example, for process of the slit ST. The contact hole HLc, whose aspect ratio is larger than that of the slit ST, will therefore have generated therein a deposition as a by-product of etching, whose amount becomes larger at larger depth, thus gradually deforming the cross section with irregularity.

The contact hole HLc has a cross-sectional shape which causes irregularity and becomes distorted at the lower end as illustrated in FIG. 7Da, from the circular, elliptic or oval shape at the upper end.

As illustrated in FIG. 7Bb, the insulating layer 56s is also formed on the sidewalls of the slit ST in a region which will later become the through-contact region TP, parallelly with the process illustrated in FIG. 7Ab. Also the insulating layer 55a is formed so as to cover the sidewall and the bottom face of the contact hole HLc. The insulating layer 55a may be formed parallelly with the insulating layer 56s in the slit ST, or individually of the insulating layer 56s.

As illustrated in FIG. 7Cb, the insulating layer 55a, formed at the upper end of the contact hole HLc, is relatively smooth and has nearly uniform thickness around the outer circumferential face of the contact hole HLc.

As illustrated in FIG. 7Db, the insulating layer 55a, formed at the lower end of the contact hole HLc, has irregularity and has non-uniform thickness around the outer circumferential face of the contact hole HLc.

As illustrated in FIGS. 7Bc, 7Cc, and 7Dc, the region which will later become the through-contact region TP is not subjected to any process, while the process illustrated in FIG. 7Ac is ongoing. During this process, the region which will later become the through-contact region TP may alternatively protected typically with a mask layer, so as not to be affected by the process illustrated in FIG. 7Ac.

FIGS. 8A to 8C illustrate cross sections taken along the Y-direction of a region which will later become the through-contact region TP, similarly to FIGS. 7Ba to 7Bc.

As illustrated in FIG. 8A, a source gas of amorphous silicon or the like is injected into the contact hole HLc and the slit ST. In the region which will later become the memory region MR, the source gas is injected through the slit ST whose sidewalls are protected with the insulating layer 56s, so as to fill the gap layer GPs with amorphous silicon or the like, thereby forming an amorphous silicon layer. The amorphous silicon layer is a layer before being turned into the intermediate source line BSL, as a result of crystallization of amorphous silicon or the like.

On the other hand, the space in the contact hole HLc has a smaller volume than the space in the slit ST, with the bottom face covered with the insulating layer 55a, thus given as a closed space. Hence, a semiconductor layer 25b formed of amorphous silicon or the like is formed on the sidewall and the bottom face of the contact hole HLc, so as to fill the contact hole HLc while leaving a thin void at the center.

Note that the semiconductor layer 25b may alternatively be formed while leaving a thin void in the contact hole HLc, individually of formation of the amorphous silicon layer in the gap layer GPs.

As illustrated in FIG. 8B, a mask layer 60 such as a resist layer, having an opening at the contact hole HLc, is formed so as to cover the slit ST.

The semiconductor layer 25b in the contact hole HLc is thinned by wet etching. Wet etching solution employable here is typically an alkaline solution such as TMY (trimethyl-2-hydroxyethylammonium hydroxide). Alternatively, NC2 which is a mixed chemical liquid of TMY and hydrogen peroxide solution is employable. Etching conditions are controlled so as to suppress the etching rate to a predetermined level or below.

As illustrated in FIG. 8C, the semiconductor layer 25b that remained in the contact hole HLc is oxidized to form the insulating layer 55b typically formed of a silicon oxide layer. The semiconductor layer 25b may be oxidized, typically by annealing in an oxygen atmosphere. The insulating layer 55b is thus formed so as to cover the sidewalls and the bottom face of the contact hole HLc.

Thermal oxidation of the semiconductor layer 25b also polycrystallizes amorphous silicon that composes the amorphous silicon layer in the gap layer GPs, to form the intermediate source line BSL that contains polysilicon or the like. Note that the thermal treatment for forming the intermediate source line BSL from the amorphous silicon layer in the gap layer GPs may take place individually. Still alternatively, the thermal oxidation of the semiconductor layer 25b and the thinning of the semiconductor layer 25b followed by the thermal oxidation thereof may take place immediately before the conductive layer 21 is filled in the contact hole HLc. An example of such modified process sequence in the contact hole HLc will be descried later.

Figures 9A, 9B:
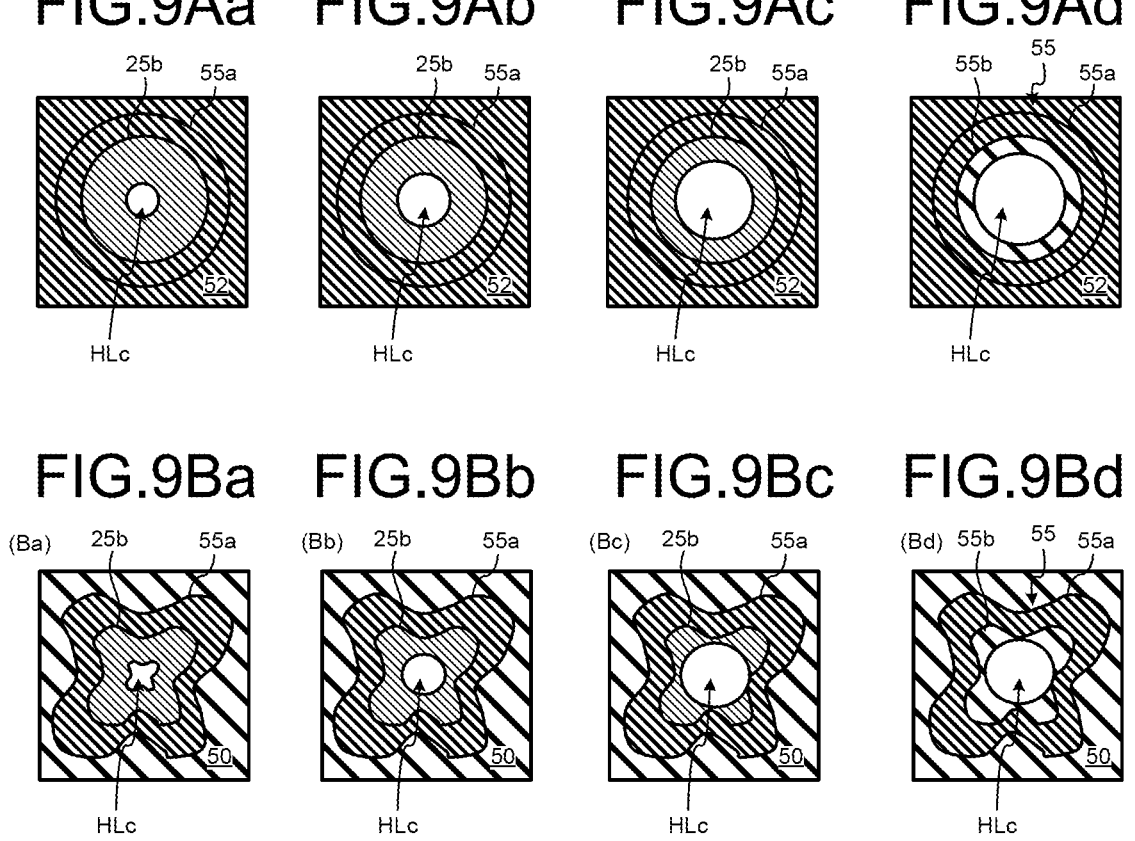
FIGS. 9Aa to 9Bd are drawings sequentially illustrating the part of exemplary procedures of the method for manufacturing the semiconductor memory device according to the first embodiment.

FIGS. 9Aa to 9Bd illustrate details of the processes having been illustrated in FIGS. 8A to 8C for the contact hole HLc. FIGS. 9Aa to 9Bd are cross sections taken along the XY-plane of the contact hole HLc, wherein FIGS. 9Aa to 9Ad illustrate cross sections near the upper end of the contact hole HLc, and FIGS. 9Ba to 9Bd illustrate cross sections near the lower end of the contact hole HLc.

As illustrated in FIGS. 9Aa and 9Ba, the semiconductor layer 25b is formed inside the insulating layer 55a having been formed in the contact hole HLc. Further inside the semiconductor layer 25b, there remains a thin void that extends in the contact hole HLc in the stacking direction of the stacked body LMs.

The semiconductor layer 25b, formed at the upper end of the contact hole HLc, is relatively smooth and has nearly uniform thickness, along the inner circumferential face of the insulating layer 55a.

The semiconductor layer 25b, formed at the lower end of the contact hole HLc, has irregularity and has non-uniform thickness along the inner circumferential face of the insulating layer 55a. Note that the irregularity of the outer circumferential face of the contact hole HLc may be moderated when viewed on the inner circumferential face of the insulating layer 55a, making the irregularity of the semiconductor layer 25b smaller than that of the outer circumferential face of the contact hole HLc.

As illustrated in FIGS. 9Ab and 9Bb, the semiconductor layer 25b is treated with a wet etching solution under low etching rate conditions. The wet etching solution enters the void in the semiconductor layer 25b, and etches the semiconductor layer 25b from inside to widen the void.

Typically at the lower end of the contact hole HLc under such low etching rate conditions in this process, the semiconductor layer 25b is etched so that a protrusion in the irregularity on the inner circumferential face, which protrudes into the void, is etched off preferentially. This is presumably because, under such low etching rate conditions, not only a chemical reaction due to the wet etching solution, but also a physical reaction will become noticeable.

Hence, typically at the lower end of the contact hole HLc, the irregular profile on the inner circumferential face of the semiconductor layer 25b is gradually smoothened. In addition, the cross-sectional shape of the void, when viewed in a direction along the XY-plane, typically becomes closer to a circular, elliptic or oval shape with moderated irregularity, according to the cross-sectional shape of the contact hole HLc at the upper end.

The wet etching under the low etching rate conditions is further kept continued as illustrated in FIGS. 9Ac and 9Bc. The semiconductor layer 25b in the contact hole HLc thus becomes thinner. Also the void in the semiconductor layer 25b becomes wider.

In this process, typically at the lower end of the contact hole HLc, a part of the semiconductor layer 25b, having been locally thinned than the other part, may be fully removed, to make the inner circumferential face of the insulating layer 55a exposed to the circumference of the void in the contact hole HLc.

In this case, such local and full removal of the semiconductor layer 25b partially interrupts the semiconductor layer 25b having continuously surrounded the circumference of the void, causing intermittent surrounding around the circumference of the void. In this way, the semiconductor layer 25b tends to discontinuously cover the inner circumferential face of the insulating layer 55a, at the lower end side of the contact hole HLc.

In this process, also with the etching conditions preliminarily adjusted to keep high selectivity against the insulating layer 55a, the wet etching is suppressed on the insulating layer 55a even at a site where the inner circumferential face of the insulating layer 55a has exposed. This further moderates the irregularity of the void, typically making the cross-sectional shape closer to a circular, elliptic, or oval shape.

In some cases, the semiconductor layer 25b, having continuously surrounded the circumference of the void, would be fully removed at the upper end of the contact hole HLc, typically because the semiconductor layer 25b did not have an extremely thick part. The contact hole HLc thus tends to have, at the upper end side thereof, no semiconductor layer 25b on the inner circumferential face of the insulating layer 55a.

The wet etching is therefore terminated at a point where the roughness of the inner circumferential face of the semiconductor layer 25b, that is, of the outer circumferential face of the void, reaches a predetermined level or below, and the void is sufficiently widened. With the void having a sufficient cross-sectional area and later filled with the conductive layer 21, the through-contact C4 will have a contact resistance suppressed within a predetermined range.

As illustrated in FIGS. 9Ad and 9Bd, the semiconductor layer 25b is gradually oxidized from the side of the void, typically by annealing in an oxygen atmosphere, thereby forming the insulating layer 55b typically formed of a silicon oxide layer. The insulating layer 55 that contains the insulating layers 55a and 55b is thus formed.

As described above, the semiconductor layer 25b having surrounded the outer circumference of the void is oxidized to acquire insulation property, making the through-contact C4, obtained by later filling the void with the conductive layer 21, sufficiently insulated from the circumference.

The insulating layer 55b, thus formed by oxidizing the semiconductor layer 25b, may typically have physical property and composition different from those of the insulating layer 55a. For example, the insulating layer 55b may have higher crystallinity than insulating layer 55a, while being inherited from the crystal structure of the semiconductor layer 25b. The insulating layer 55b may have an average grain diameter of the crystals, larger than the average grain diameter of the crystals in the insulating layer 55a. The insulating layer 55b may have, remained therein, a source gas component of the semiconductor layer 25b such as hydrogen atom, at a higher concentration than in the insulating layer 55a.

Figure 10A:
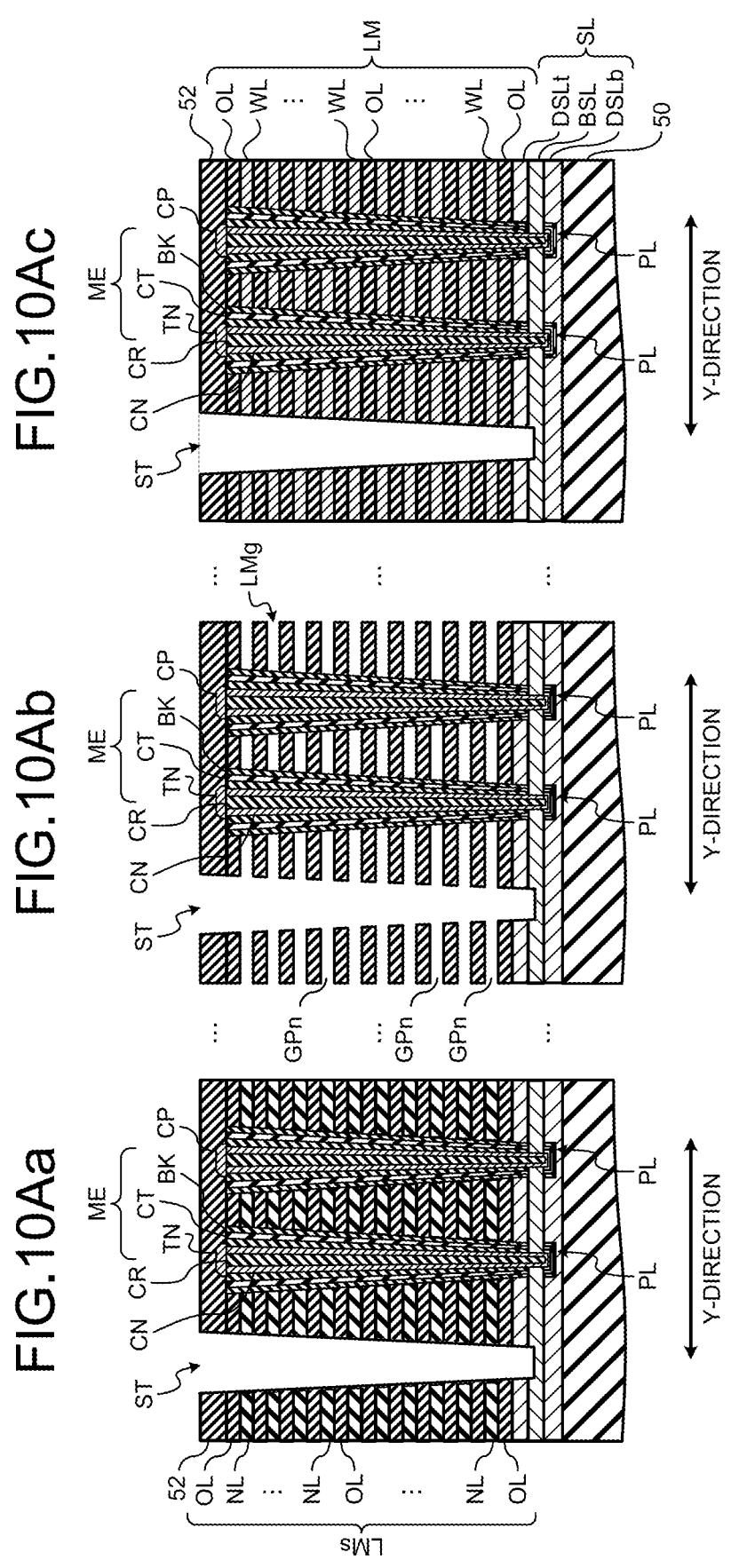
FIGS. 10Aa to 10Bc are drawings sequentially illustrating the part of exemplary procedures of the method for manufacturing the semiconductor memory device according to the first embodiment.

Next, FIGS. 10Aa and 10Bc illustrate events during replacement of the insulating layer NL with the word line WL.

Figure 10B:
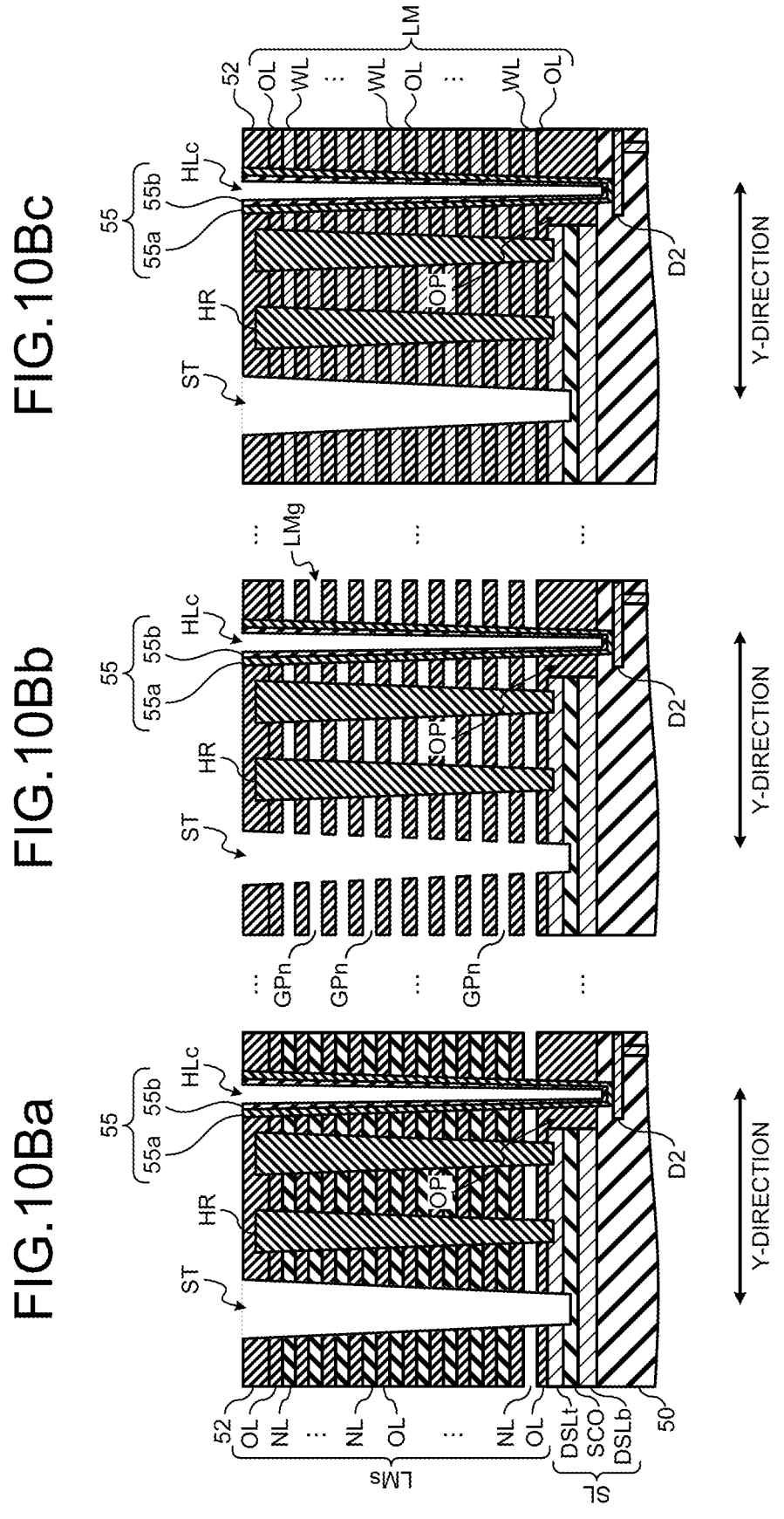

FIGS. 10Aa to 10Ac illustrate cross sections taken along the Y-direction of a region that will later become the memory region MR, similarly to FIGS. 7Aa to 7Ac. FIGS. 10Ba to 10Bc illustrate cross sections taken along the Y-direction of a region which will later become the through-contact region TP, similarly to FIGS. 8A to 8C.

As illustrated in FIG. 10Aa, typically as a result of the aforementioned annealing illustrated in FIG. 8C, the amorphous silicon layer in the gap layer GPs sandwiched between the bottom source line DSLb and the top source line DSLt, is polycrystallized to become the intermediate source line BSL, in the memory region MR. This has already finished a structure in which the channel layer CN exposed from the memory layer ME is electrically connected through the intermediate source line BSL to the source line SL.

As illustrated in FIGS. 10Aa and 10Ba, the insulating layer 56s formed on the sidewalls of the slit ST is removed. In this case, typically before a later-described treatment in the contact hole HLc will be resumed, the contact hole HLc may be protected with a mask layer such as a resist layer, so that the insulating layer 55 in the contact hole HLc will not be removed.

As illustrated in FIGS. 10Ab and 10Bb, a removal liquid for the insulating layer NL, such as hot phosphoric acid, is injected through the slit ST into the stacked body LMs, to remove the insulating layer NL of the stacked body LMs. A stacked body LMg, having a plurality of gap layers GPn remained after removing the insulating layers NL between the insulating layers OL, is thus formed.

The stacked body LMg, thus having the plurality of gap layers GPn formed therein, is structurally weak. In the memory region MR, the plurality of pillars PL support such weak stacked body LMg. In the through-contact region TP, the plurality of columnar portions HR supports the stacked body LMg. The plurality of columnar portions HR supports the stacked body LMg, also in the staircase regions SR, and in the steps at both ends in the X-direction and both ends in the Y-direction of the stacked body LMg.

With these support structures including the pillars PL and the columnar portions HR, the remained insulating layer OL may be suppressed from warping, or the stacked body LMg may be suppressed from distorting or collapsing.

As illustrated in FIGS. 10Ac and 10Bc, a source gas of a conductor such as tungsten or molybdenum is injected through the slit ST into the stacked body LMg, so as to fill the gap layers GPn in the stacked body LMg with the conductor, thus forming the plurality of word lines WL. The stacked body LM, in which the plurality of word lines WL and the plurality of insulating layers OL are alternately stacked one by one, is thus formed.

Note that the process for replacing the insulating layer NL with the word line WL, illustrated in FIGS. 10Aa to 10Bc, may occasionally be referred to as a replacement process.

Figure 11A:
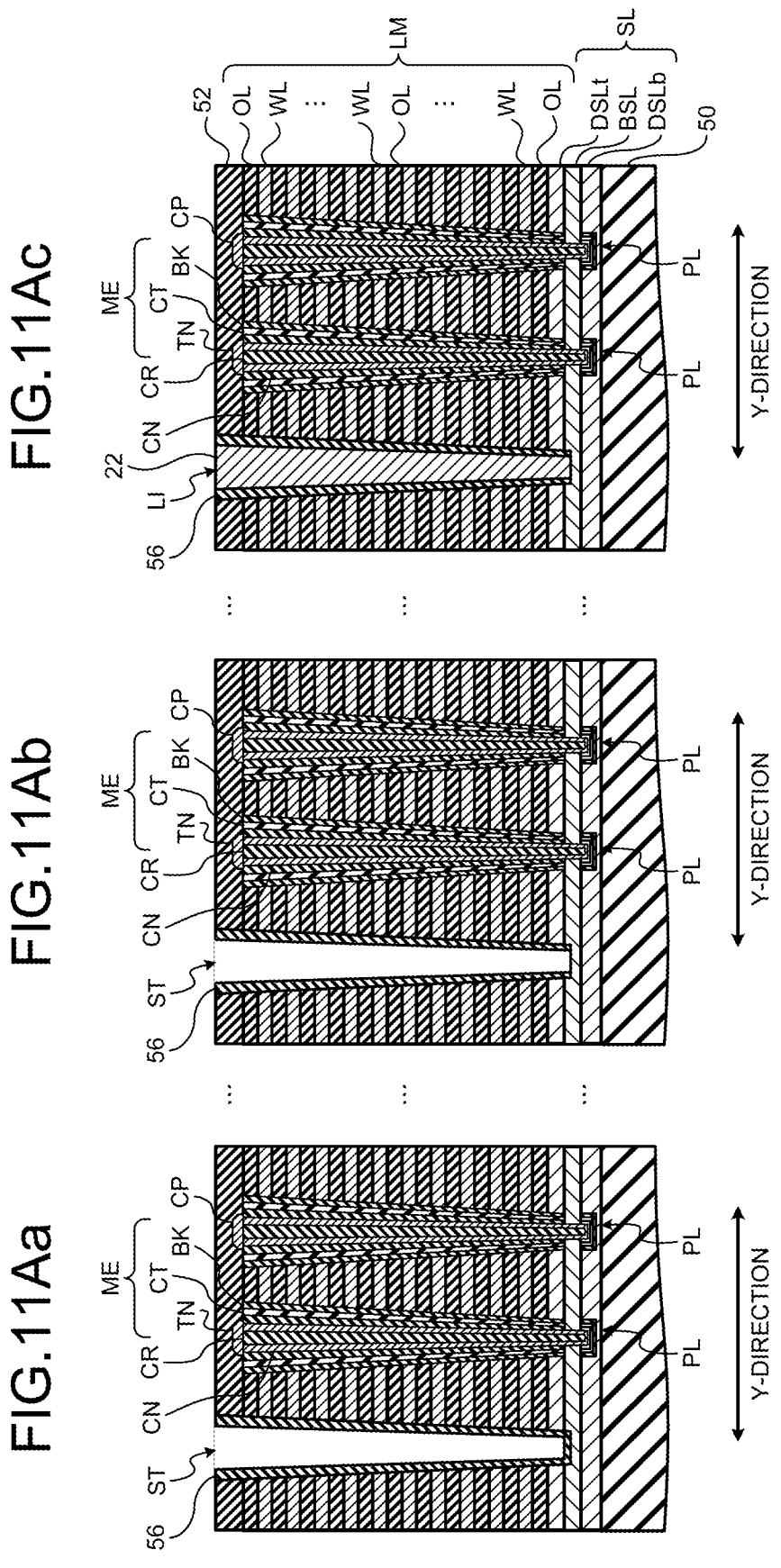
FIGS. 11Aa to 11Bc are drawings sequentially illustrating the part of exemplary procedures of the method for manufacturing the semiconductor memory device according to the first embodiment.

Next, FIGS. 11Aa to 12K illustrate events during formation of the plate-like contact LI and the through-contact C4.

FIGS. 11Aa to 11Ac are cross sections illustrating processes subsequent to the processes in the memory region MR having been illustrated in FIGS. 10Aa to 10Ac. FIGS. 11Ba to 11Bc are cross sections illustrating processes subsequent to the processes in the through-contact region TP having been illustrated in FIGS. 10Ba to 10Bc.

As illustrated in FIGS. 11Aa and 11Ba, the insulating layer 56 is formed so as to cover the sidewalls and the bottom face of the slit ST.

As illustrated in FIGS. 11Ab and 11Bb, the insulating layer 56 that covers the bottom face of the slit ST is removed. Also the insulating layer 55 that covers the bottom face of the contact hole HLc is removed. The removal of the insulating layer 55 may take place collectively with the removal of the insulating layer 56, or may be individually of the removal of the insulating layer 56.

As illustrated in FIGS. 11Ac and 11Bc, the conductive layer 22 is filled inside the insulating layer 56 of the slit ST.

The plate-shaped contact LI, through which the conductive layer 22 is connected to the source line SL, is thus formed.

Also the conductive layer 21 is filled inside the insulating layer 55 of the contact hole HLc. The filling of the conductive layer 21 may take place collectively with the filling of the conductive layer 22 into the slit ST, or may be individually of the filling of the conductive layer 22. The through-contact C4, through which the conductive layer 21 is connected to the lower wiring D2 arranged in the insulating layer 50, is thus formed.

FIGS. 12A to 12K illustrate details of the processes for the contact hole HLc having been illustrated in FIGS. 11Bb to 11Bc. FIGS. 12A to 12K are enlarged cross-sectional views of the lower end of the contact hole HLc taken in a direction along the Y-direction, exemplifying several process shapes of the insulating layers 55a and 55b.

As illustrated in FIGS. 12A to 12K, the through-contact C4 is more specifically formed typically by etching off the insulating layers 55a and 55b on the bottom face of the contact hole HLc, by wet-etching the lower wiring D2 exposed to the bottom face of the contact hole HLc, and then by filling the conductive layer 21 into the contact hole HLc. The process shapes of the insulating layers 55a and 55b can vary in various ways from each other, typically depending on process conditions for the contact hole HLc, or physical properties of the insulating layers 55a and 55b.

FIG. 12A illustrates an appearance of the lower end of the contact hole HLc, before the aforementioned process.

FIGS. 12B and 12G illustrate several exemplary process shapes of the insulating layers 55a and 55b which can appear in the process of etching off the insulating layers 55a and 55b at the bottom face of the contact hole HLc.

FIGS. 12C and 12E illustrate several exemplary process shapes of the insulating layers 55a and 55b which can appear as a result of the wet etching subsequent to the process illustrated in FIG. 12B. Meanwhile, FIGS. 12H and 12J illustrate several exemplary process shapes of the insulating layers 55a and 55b which can appear as a result of the wet etching subsequent to the process illustrated in FIG. 12G.

FIGS. 12D, 12F, 12I, and 12K illustrate several exemplary shapes of the through-contacts C4 obtained by the filling of the conductive layer 21. Examples illustrated in FIGS. 12A to 12K will be described below step by step.

As illustrated in FIG. 12A, before the processes illustrated in FIGS. 11Bb to 11Bc, the lower end of the contact hole HLc that reaches the top face of the lower wiring D2 is covered with the insulating layer 55a, and the inside of the insulating layer 55a is further covered with the insulating layer 55b.

As illustrated in FIG. 12B, the insulating layers 55a and 55b on the bottom face of the contact hole HLc are removed typically by dry etching such as reactive ion etching (RIE).

Despite slight differences in the physical properties, both the insulating layers 55a and 55b are made of a similar material such as silicon oxide. Dry etching such as RIE does not demonstrate high selectivity attributable to difference in physical properties, unlike the wet etching.

The respective etched end faces EEa and EEb of the insulating layers 55a and 55b are therefore directed inwards the contact hole HLc, while being kept in flush with each other without being terraced.

After removal of the insulating layers 55a and 55b from the bottom face of the contact hole HLc, the top face of the lower wiring D2 exposed to the bottom of the contact hole HLc is treated typically with a wet etching solution. The top face of the lower wiring D2 is thus cleaned, so that the through-contact C4, after filled with the conductive layer 21 to be joined with the lower wiring D2, will have reduced resistivity.

In this process, the insulating layers 55*a* and 55*b* having different physical properties may have different process shapes, typically depending on type of the wet etching solution, and conditions for the wet etching. More specifically, the insulating layer 55*b*, whose crystallinity is higher than that of the insulating layer 55*a*, is considered to be more resistant against the wet etching solution, thus demonstrating lower etching rate.

FIG. 12C illustrates an exemplary shape obtainable when the etching rate of the insulating layer 55*a* is slightly higher than that of the insulating layer 55*b*.

As illustrated in FIG. 12C, although the etched end face EEa of the insulating layer 55*a* in this case is set back from a plane flush with the etched end face EEb of the insulating layer 55*b*, the lower end of the insulating layer 55*a* is typically kept in contact with the top face of the lower wiring D2. Since for example the insulating layer 55*b* substantially maintains the shape before the wet etching, so that the lower end of the insulating layer 55*b* is positioned above the lower end of the insulating layer 55*a*, making the lower end and the periphery of the insulating layer 55*a* exposed to the inside of the contact hole HLc, at a point in the contact hole HLc more outer than the lower end of the insulating layer 55*b*. Hence, the contact hole HLc has, formed on the side face thereof, a terrace that extends from the lower end of the insulating layer 55*b* to the side face of the insulating layer 55*a*.

The top face of the lower wiring D2 becomes slightly depressed, due to the wet etching that took place on the top face of the lower wiring D2.

As illustrated in FIG. 12D, the shape of the insulating layers 55*a* and 55*b*, terraced on the sidewall of the contact hole HLc, is maintained even in the through-contact C4 obtained after filling the contact hole HLc with the conductive layer 21. The recess on the top face of the lower wiring D2 is refilled with the conductive layer 21.

FIG. 12E illustrates an exemplary shape obtainable when the etching rate of the insulating layer 55*a* is more distinctively higher than that of the insulating layer 55*b*.

As illustrated in FIG. 12E, the lower end of the insulating layer 55*a* in this case is positioned behind and above the lower end of the insulating layer 55*b*, and such lower end of the insulating layer 55*b* extends downward so as to terminate below the lower end of the insulating layer 55*a*. Hence, the contact hole HLc has, formed on the side face thereof, a terrace that extends from the lower end of the insulating layer 55*b* backwards the lower end of the insulating layer 55*a*.

With the insulating layers 55*a* and 55*b* thus shaped, the contact hole HLc may occasionally expose the sidewall thereof at the lower end, so that the etching conditions are preferably controlled so that the wet etching solution will not erode the sidewall of the contact hole HLc.

As illustrated in FIG. 12F, the shape of the insulating layers 55*a* and 55*b*, terraced on the sidewall of the contact hole HLc, is maintained even in the through-contact C4 obtained after filling the contact hole HLc with the conductive layer 21. With the sidewall of the contact hole HLc thus suppressed from being eroded, the filled conductive layer 21 is suppressed from swelling out of the through-contact C4.

Meanwhile, in a case where the insulating layers 55*a* and 55*b* on the bottom face of the contact hole HLc are removed typically by dry etching, the insulating layers 55*a* and 55*b* would partially remain on the bottom face of the contact hole HLc.

FIG. 12G illustrates an exemplary shape obtainable when the insulating layers 55*a* and 55*b* partially remained on the bottom face of the contact hole HLc. Difference between the shapes illustrated in FIG. 12G and FIG. 12B can arise mainly from difference in the dry etching conditions. For example, the shape illustrated in FIG. 12G, rather than the shape illustrated in FIG. 12B, is more obtainable when the dry etching time, including over-etching time, is short.

As illustrated in FIG. 12G, parts of the insulating layers 55*a* and 55*b* in this case extend inwards the contact hole HLc at and around the bottom face of the contact hole HLc, and cover the outer periphery of the bottom face of the contact hole HLc. Also in this case, the etched end faces EEa and EEb of the respective insulating layers 55*a* and 55*b* are directed inwards the contact hole HLc, while being kept in flush without being terraced.

Even in a case where the wet etching of the lower wiring D2 starts from such state, the insulating layers 55*a* and 55*b* may occasionally result in different process shapes.

FIG. 12H illustrates an exemplary shape obtainable when the etching rate of the insulating layer 55*a* is slightly higher than that of the insulating layer 55*b*.

In this case as illustrated in FIG. 12H, the end of the insulating layer 55*b* that covers the outer periphery of the bottom face of the contact hole HLc protrudes in the contact hole HLc, more inwards than the end of the insulating layer 55*a*. The end of the insulating layer 55*a* is positioned more outwards in the contact hole HLc than the end of the insulating layer 55*b*, so as to be recessed from the end of the insulating layer 55*b*. This consequently forms a terrace shaped so as to extend from the end of the insulating layer 55*b*, towards the end of the insulating layer 55*a* positioned behind.

As illustrated in FIG. 12I, the shape of the insulating layers 55*a* and 55*b*, terraced on the bottom face of the contact hole HLc, is maintained even in the through-contact C4 obtained after filling the contact hole HLc with the conductive layer 21.

FIG. 12J illustrates an exemplary shape obtainable when the etching rate of the insulating layer 55*a* is more distinctively higher than that of the insulating layer 55*b*.

In this case as illustrated in FIG. 12J, the end of the insulating layer 55*a*, having covered the outer periphery of the bottom face of the contact hole HLc, sets back onto the sidewall of the contact hole HLc. The end of the insulating layer 55*b* stays above the bottom face of the contact hole HLc, and the lower end of the insulating layer 55*b* that maintains an L-shaped cross section protrudes above the bottom face of the contact hole HLc, while being terminated below the lower end of the insulating layer 55*a*. This consequently forms a terrace shaped so as to extend from the end of the insulating layer 55*b* having an L-shaped cross section, towards the end of the insulating layer 55*a* positioned behind.

Even with the insulating layers 55*a* and 55*b* thus shaped, the contact hole HLc may occasionally expose the sidewall thereof at the lower end, so that the etching conditions are preferably controlled so that the wet etching solution will not erode the sidewall of the contact hole HLc.

As illustrated in FIG. 12K, the shape of the insulating layers 55*a* and 55*b*, terraced over the range from the bottom face to the sidewall of the contact hole HLc, is maintained even in the through-contact C4 obtained after filling the contact hole HLc with the conductive layer 21. With the sidewall of the contact hole HLc thus suppressed from being eroded, the filled conductive layer 21 is suppressed from swelling out of the through-contact C4.

After the through-contact C4 is thus formed, a contact hole is formed in each stair of the step SP so as to reach the uppermost word line WL that belongs to that stair, the insulating layer 57 is formed on the sidewall of the contact hole, and the conductive layer 23 is filled inside the insulating layer 57, thereby forming a contact CC that is connected to each of the plurality of word lines WL.

The insulating layer 53 is formed on the insulating layer 52, and a plug V0 is formed so as to extend through the insulating layer 53, and to be connected to each of the plate-like contact LI, the through-contact C4, and the contact CC. Also the plug CH is formed so as to extend through the insulating layers 53 and 52, and to be connected to the pillar PL. Still also formed are the upper wiring MX and the bit line BL that are respectively connected to the plugs V0 and CH.

The semiconductor memory device 1 of the first embodiment is thus manufactured.

In a process of manufacturing a semiconductor memory device such as a three-dimensional nonvolatile memory, there is a situation that a contact hole that extends through a stacked body, formed of conductive layers and insulating layers, is formed typically by plasma etching. In this process, for example, a product of plasma etching may deposit on the sidewall of the contact hole, making the sidewall of the contact hole more irregular as the etching proceeds deeper, and making the cross-sectional shape of the contact hole distorted.

If the distorted contact hole is lined with an insulating layer, and a conductive layer is then filled inside the insulating layer to form a through-contact, the insulating layer would have non-uniform thickness, and would fail in achieving a sufficient level of withstand voltage at a thinned point. Meanwhile, also the conductive layer would have a distorted contour with irregularity, and would further degrade the withstand voltage of the through-contact, typically due to concentration of electric field on a protrusion.

The semiconductor memory device 1 of the first embodiment has the through-contact C4, in which the roughness of the outer circumferential face of the conductive layer 21 is lower than the roughness of the outer circumferential face of the insulating layer 55, at least at a point close to the lower end.

In other words, in the through-contact C4 and at least at a point close to the lower end, a variation, in the circumferential direction, in the distance measured from the center point of the conductive layer 21 to the outer edge of the insulating layer 55, when viewed in a cross section taken in a direction along the XY-plane, is larger than a variation, in the circumferential direction, of the distance measured from the center point to the outer edge of the conductive layer 21.

With such structure, it now becomes possible to form the insulating layer 55, which is sufficiently thick along the outer circumference of the conductive layer 21 at a point where the through-contact C4 extends through the stacked body LM, and to suppress concentration of the electric field due to the irregularity on the conductive layer 21, thereby improving the withstand voltage of the through-contact C4.

The semiconductor memory device 1 of the first embodiment has, at least at and around the lower end of the through-contact C4, while including the outer edge of the insulating layer 55, the insulating layer 55a that is arranged on the outer circumferential side of the through-contact C4 and the insulating layer 55b that is arranged to adjoin the outer edge of the conductive layer 21, and on the inner side of the through-contact C4 than the insulating layer 55a.

The thus structured insulating layer 55 is obtainable as described above, typically by forming a semiconductor layer 25b inside the insulating layer 55a, wet-etching the semiconductor layer 25b under a low etching rate condition so as to smoothen the inner circumferential face, and oxidizing the semiconductor layer 25b, the inside of which is filled with the conductive layer 21.

Since the inner circumferential face of the semiconductor layer 25b is oxidized after being smoothened, so that insulating property of the insulating layer 55 and roughness of the outer circumferential face of the conductive layer 21 are improved, whereby the withstand voltage of the through-contact C4 is improved.

Having described in the first embodiment that the insulating layer 55b was formed from the semiconductor layer 25b, the embodiment is not limited thereto. For example, a silicon nitride layer or the like may be formed inside the insulating layer 55a, and may be smoothened by wet etching at low etching rate.

The wet etching solution employable in this case may typically be a hot deionized water (HDIW). Even though the silicon nitride layer is an insulating layer, it is still preferable to oxidize the silicon nitride layer after smoothened. The silicon nitride layer turns into a silicon oxynitride layer after the oxidation.

Modified Example

Next, a semiconductor memory device according to a modified example of the first embodiment will be described, referring to FIGS. 13A to 13G. In the semiconductor memory device of the modified example, the order of processes for forming the through-contact C4 is different from that in the first embodiment.

FIGS. 13A to 13G are cross-sectional views illustrating a part of exemplary procedures of a method for forming the through-contact C4 according to a modified example of the first embodiment. FIGS. 13A to 13G are enlarged cross-sectional views of the lower end of the contact hole HLc taken in a direction along the Y-direction, similarly to FIGS. 12A to 12K.

Figures 13A, 13B, 13C, 13D, 13E, 13F, 13G:
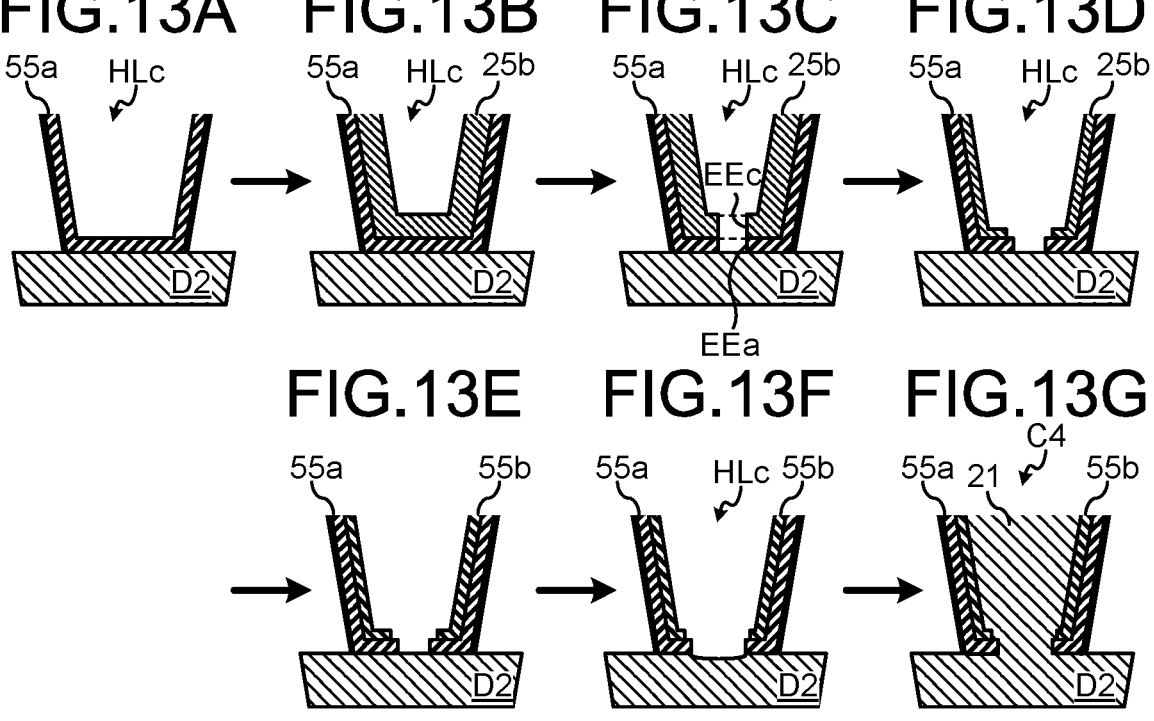
FIGS. 13A to 13G are cross-sectional views illustrating a part of exemplary procedures of a method for forming a through-contact according to a modified example of the first embodiment.

FIG. 13A illustrates an appearance before the process having been illustrated in FIG. 8A. The contact hole HLc has the insulating layer 55a formed on the sidewall and on the bottom face.

As illustrated in FIG. 13B, the semiconductor layer 25b is formed inside the contact hole HLc, by the process having been illustrated in FIG. 8A. The semiconductor layer 25b is formed on the insulating layer 55a having been formed on the sidewall and the bottom face of the contact hole HLc, while leaving a void that extends in the stacking direction of the stacked body LMs, at the center of the contact hole HLc.

After subjecting the stacked body LMs in this state to the replacement process, the insulating layer 55a and the semiconductor layer 25b are removed on the bottom face of the contact hole HLc, typically by dry etching such as RIE, as illustrated in FIG. 13C. The top face of the lower wiring D2 thus exposes to the bottom face of the contact hole HLc. As described above, the insulating layer 55a and the semiconductor layer 25b of the semiconductor memory device of the modified example are removed on the bottom face of the contact hole HLc, before the semiconductor layer 25b is smoothened and oxidized.

The process at this time typically employs an etching condition under which the selectivity between the insulating layer 55a and the semiconductor layer 25b is low. The respective etched end faces EEa and EEc of the insulating layers 55*a* and the semiconductor layer 25*b*, faced inwards the contact hole HLc, are thus formed flush without being terraced.

As illustrated in FIG. 13D, the semiconductor layer 25*b* is wet-etched under a low etching rate condition, thereby thinning the semiconductor layer 25*b* and moderating irregularity on the sidewall.

The wet etching in this process employs a condition under which high selectivity against the insulating layer 55*a* is demonstrated. Hence, the end of the semiconductor layer 25*b* that covers the outer periphery of the bottom face of the contact hole HLc recesses in the contact hole HLc more outwards than the end of the insulating layer 55*a*. Hence, the contact hole HLc has, on the bottom face thereof, a terrace that extends from the end of the semiconductor layer 25*b* to the top face of the insulating layer 55*a*.

As illustrated in FIG. 13E, the semiconductor layer 25*b* that remained in the contact hole HLc is oxidized. The insulating layer 55*b* is thus formed from the semiconductor layer 25*b*. Also in the oxidized insulating layer 55*b*, the aforementioned process shape, typically terraced on the insulating layer 55*a*, is maintained.

As illustrated in FIG. 13F, the top face of the lower wiring D2 that exposes to the bottom face of the contact hole HLc is cleaned typically by wet etching. This makes the exposed face of the lower wiring D2 recessed to form a concave shape.

Concurrently, the ends of the insulating layers 55*a* and 55*b* that cover the outer periphery of the bottom face of the contact hole HLc recess towards the outer circumference of the contact hole HLc. Although the etching rate of insulating layer 55*a* in this process tends to be higher than the insulating layer 55*b*, the difference is smaller than the difference of etching rate between the semiconductor layer 25*b* and the insulating layer 55*a*. Hence, typically the aforementioned terraced shape in the insulating layers 55*a* and 55*b* is maintained intact, or while being slightly moderated.

As illustrated in FIG. 13G, the conductive layer 21 is filled in the contact hole HLc, and connected to the lower wiring D2. In this process, the terraced shape of the insulating layers 55*a* and 55*b* on the bottom face of the contact hole HLc is maintained. The recess on the top face of the lower wiring D2 is refilled with the conductive layer 21.

The through-contact C4 having a process shape, in which the insulating layer 55*a* protrudes at and around the bottom face of the contact hole HLc more inwards than the insulating layer 55*b*, is thus obtained.

Note that, if the etching rate of the insulating layer 55*a* were extremely higher than that of the insulating layer 55*b*, the amount of protrusion of the individual ends of the insulating layers 55*a* and 55*b* may be inverted, and the insulating layers 55*a* and 55*b* may have the process shape having been illustrated in FIG. 12I or 12K, unlike the cases illustrated in of FIGS. 13A to 13G.

The semiconductor memory device of the modified example employs a different order of processes for forming the through-contact C4. Even this case can demonstrate effects same as those of the semiconductor memory device 1 of the first embodiment.

Second Embodiment

A second embodiment will be detailed below, referring to the accompanying drawings. The semiconductor memory device of the second embodiment is different from the first embodiment, in that the smoothening is repeated multiple times.

Figure 14A:
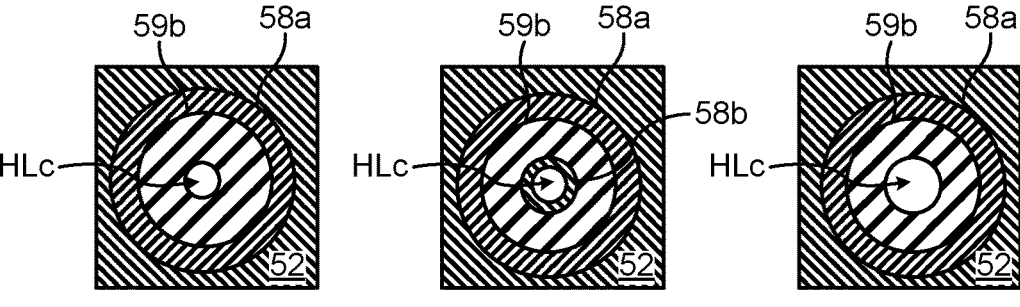
FIGS. 14Aa to 14Bc are cross-sectional views sequentially illustrating a part of procedures of a method for forming an insulating layer of a through-contact according to a second embodiment.
Figure 14B:
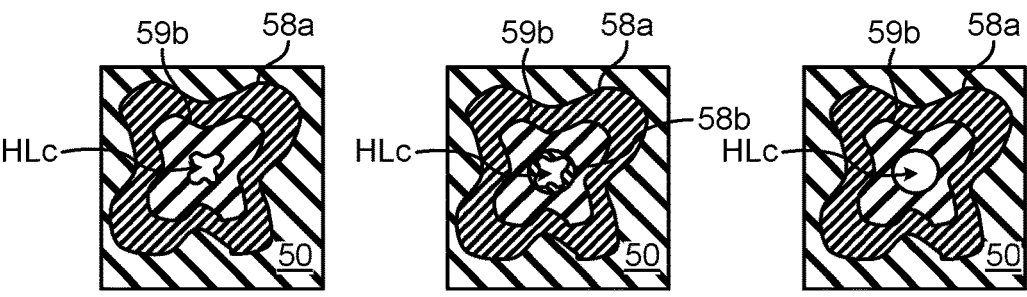

FIGS. 14Aa to 15Bc are cross-sectional views sequentially illustrating a part of exemplary procedures in a method for forming an insulating layer 58 of the through-contact according to the second embodiment. The insulating layer 58 is an insulating layer that serves as a liner of the through-contact in the second embodiment.

Figure 15A:
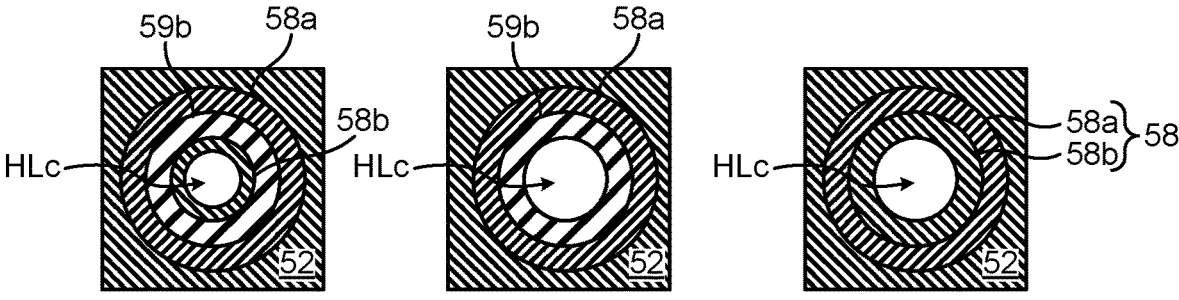
FIGS. 15Aa to 15Bc are cross-sectional views sequentially illustrating the part of procedures of the method for forming the insulating layer of the through-contact according to the second embodiment.
Figure 15B:
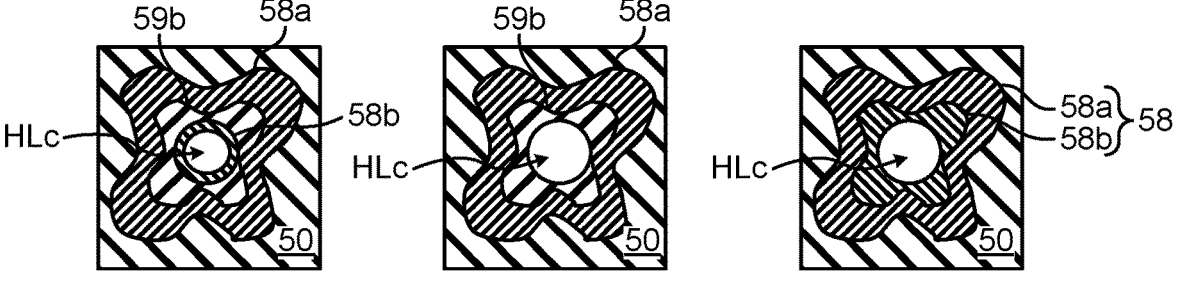

FIGS. 14Aa to 15Bc are cross sections taken along the XY-plane of the contact hole HLc, wherein the drawings whose names ended with Aa to Ac from among FIGS. 14Aa to 15Bc illustrate cross sections taken at or around the upper end of the contact hole HLc, meanwhile the drawings whose names ended with Ba to Bc from among FIG. 14Aa to FIG. 15Bc illustrate cross sections taken at or around the lower end of the contact hole HLc.

Note that, all structures in FIG. 14Aa to FIG. 15Bc same as those in the first embodiment will have same reference numerals, to skip the explanation.

As illustrated in FIGS. 14Aa and 14Ba, an insulating layer 58*a* is formed in the contact hole HLc, and an insulating layer 59*b* is formed inside the insulating layer 58*a*. The insulating layer 58*a* is typically a silicon oxide layer, and the insulating layer 59*b* is typically a silicon nitride layer. Inside the insulating layer 59*b*, there remains a void that extends in the stacking direction of the stacked body.

Similarly to the first embodiment, the contact hole HLc has a relatively smooth outer circumferential face at the upper end thereof. Hence also the insulating layers 58*a* and 59*b* are formed relatively smooth, and with a nearly uniform thickness. The contact hole HLc also has, at the lower end thereof, a distorted shape with irregularity. Hence also the insulating layers 58*a* and 59*b* are formed with irregularity and a non-uniform thickness.

As illustrated in FIGS. 14Ab and 14Bb, the inner circumferential face of the insulating layer 59*b* is subjected to oxidation. The insulating layer 59*b* is oxidized typically by annealing in an oxygen atmosphere, similarly to the aforementioned oxidation for the semiconductor layer 25*b*. A part of the insulating layer 59*b* is thus oxidized, whereby the insulating layer 58*b* such as a silicon oxynitride layer is formed on the inner circumferential face.

At the lower end portion of the contact hole HLc in this process, oxidation of the inner circumferential face of the insulating layer 59*b* with irregularity proceeds preferentially at a protrusion, since the oxidation rate is higher at the protrusion which protrudes into the void. Hence, at the lower end of the contact hole HLc, there is formed the insulating layer 58*b* whose irregularity on the outer circumferential face that adjoins to the insulating layer 59*b* is moderated from the irregularity on the inner circumferential face.

As illustrated in FIGS. 14Ac and 14Bc, the insulating layer 58*b* inside the insulating layer 59*b* is removed typically by wet etching. The wet etching solution employable here is typically TMY or NC2.

The wet etching of the insulating layer 58*b* takes place with a high selectivity against the insulating layer 59*b*. Hence at the lower end of the contact hole HLc, the insulating layer 59*b* exposed to the void in the contact hole HLc will have a relatively smooth inner circumferential face without transferring the irregularity on the inner circumferential face of the insulating layer 58*b*.

As illustrated in FIGS. 15Aa and 15Ba, the inner circumferential face of the insulating layer 59*b*, thus newly exposed, is further subjected to oxidation, to form the insulating layer 58*b* such as a silicon oxynitride layer.

As illustrated in FIGS. 15Ab and 15Bb, the insulating layer 58*b* formed by oxidation is removed typically by wet etching.

Such oxidation and wet etching of the insulating layer 59*b* may be repeated a desired number of times. As these processes are repeated, the contact hole HLc will have, at the lower end thereof, an decreased roughness of the insulating layer 59*b*.

Upon arrival at a sufficiently low level of roughness of the insulating layer 59*b*, the oxidation and the wet etching are finished, while leaving a sufficient thickness for a liner of the through-contact.

As illustrated in FIGS. 15Ac and 15Bc, the remained insulating layer 59*b* is oxidized overall, to form the insulating layer 58*b* inside the insulating layer 58*a*.

The insulating layer 58 that contains the insulating layers 58*a* and 58*b*, and serves as the liner of the through-contact is thus formed.

The insulating layers 58*a* and 58*b* thus formed are typically a silicon oxide layer and a silicon oxynitride layer, respectively, and therefore have different physical properties and chemical compositions. Hence, similarly to the aforementioned first embodiment and the modified example, the process shape at the lower end of the through-contact can vary in various ways.

As for the semiconductor memory device of the second embodiment, the insulating layer 59*b* which is typically a silicon nitride layer, is subjected to oxidation and wet etching that are repeated a predetermined number of times. Hence, the insulating layer 58 thus formed will have a further smooth inner circumferential face and a further stabilized thickness. Also since a high selectivity is obtainable between the insulating layers 58*b* and 59*b* in the process of wet etching, so that the thickness of the insulating layer 58 will be more easily controlled, and so that the insulating layer 58 will be more easily obtainable with a desired thickness.

The semiconductor memory device of the second embodiment can demonstrate effects same as those obtainable in the aforementioned first embodiment.

OTHER EMBODIMENT

Hereinafter, other embodiment will be described referring to the drawings as necessary.

The structures of the aforementioned first and second embodiments and the modified example are also applicable to structures other than the through-contact. For example, there may be a case where a contact for electrically leading out the word line WL is directly arranged in the stacked body LM. In this case, the aforementioned structures of the first and second embodiments, and of the modified example may be applied to the contact hole formed in the stacked body LM. An example of a semiconductor memory device having such contact is illustrated in FIGS. 16A to 16D.

FIGS. 16A to 16D are cross-sectional views illustrating exemplary structures of a semiconductor memory device 2 according to other embodiment.

Figure 16A:
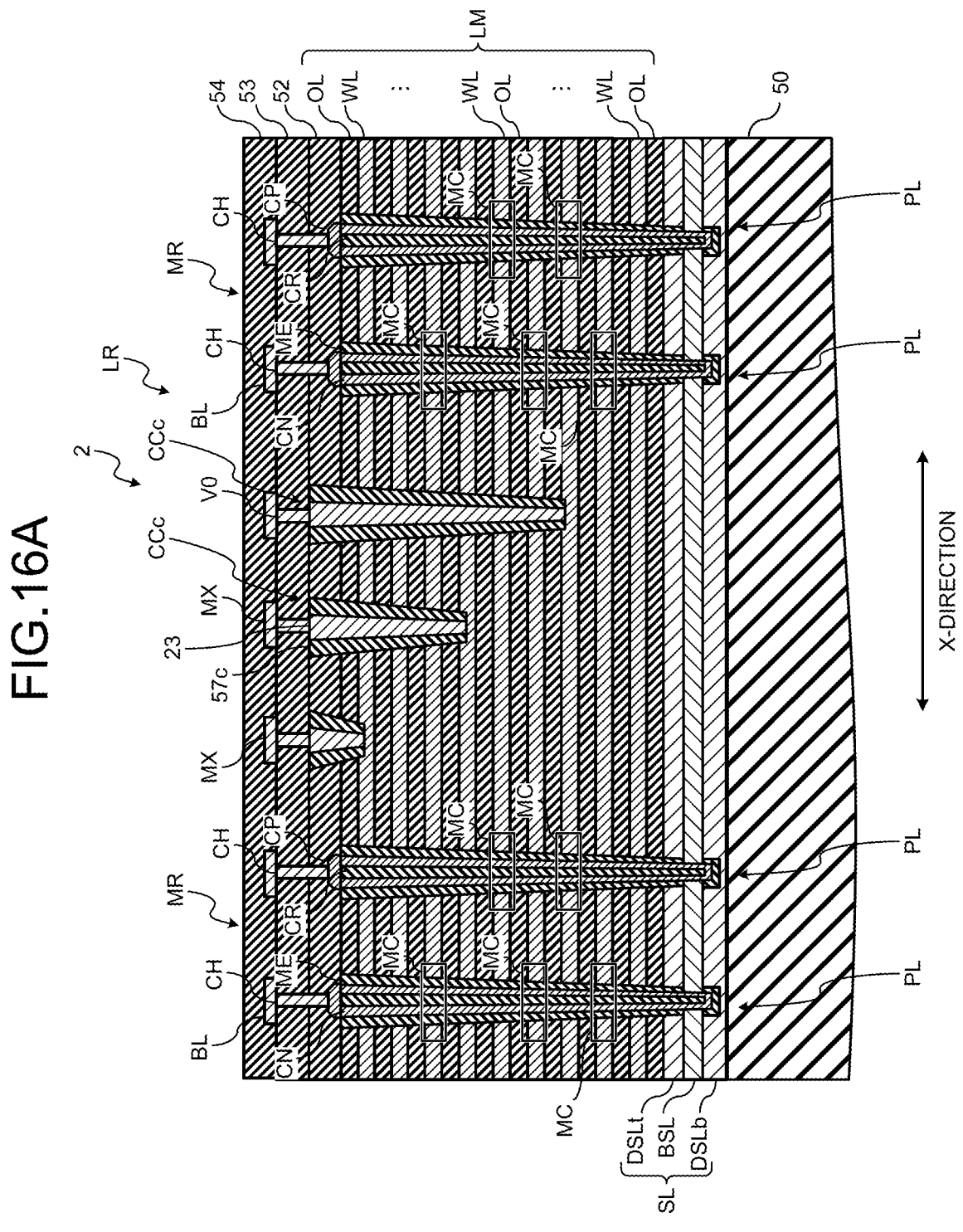
Figure 16B:
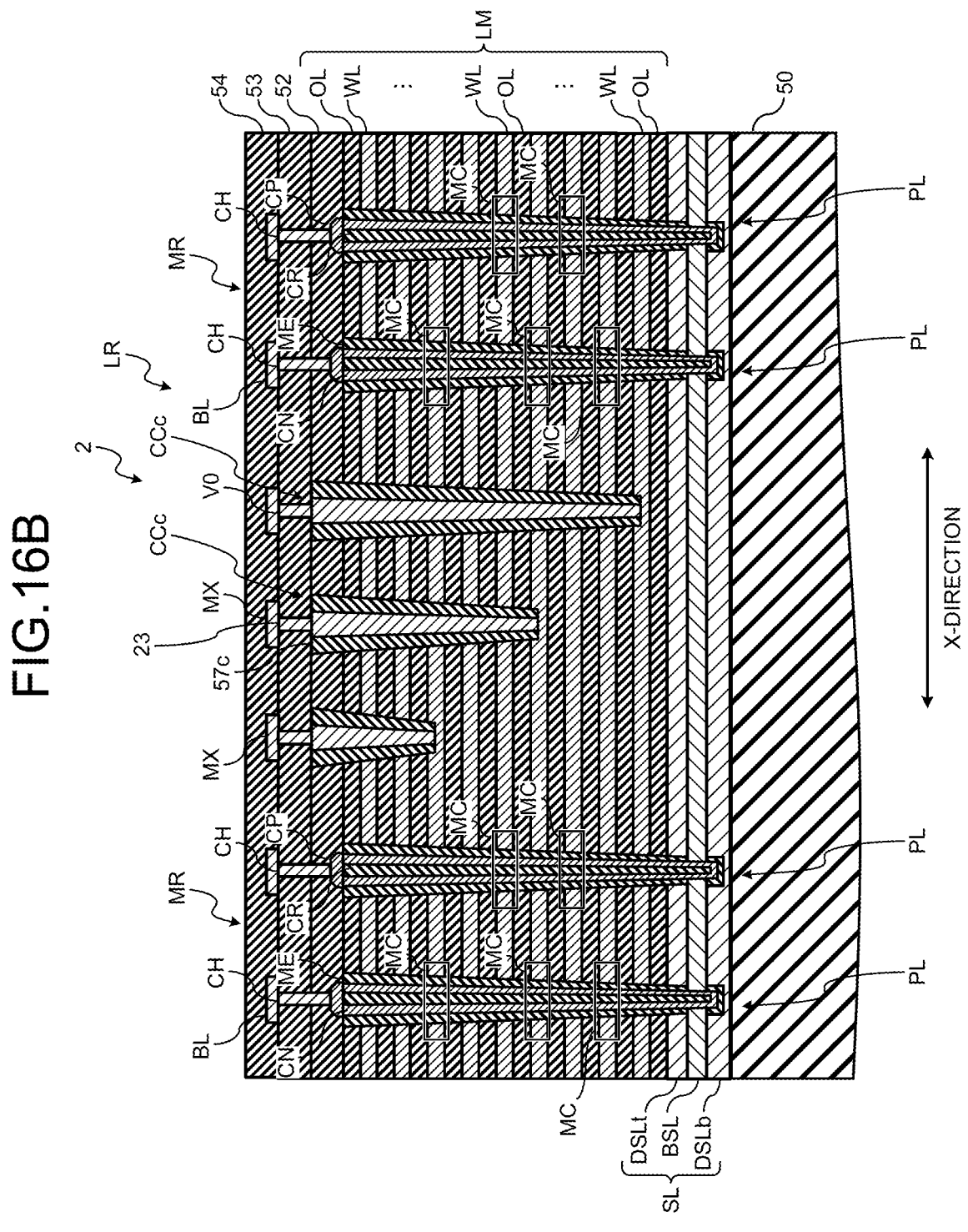

FIG. 16A is a cross-sectional view taken along the X-direction, including the memory region MR and the lead-out region LR. FIG. 16B is a cross-sectional view taken along the X-direction, including the memory region MR and the lead out region LR, illustrating a cross section different from that in FIG. 16A. Both of FIGS. 16A and 16B typically correspond to FIG. 2A explained in the first embodiment.

Figures 16C, 16D:
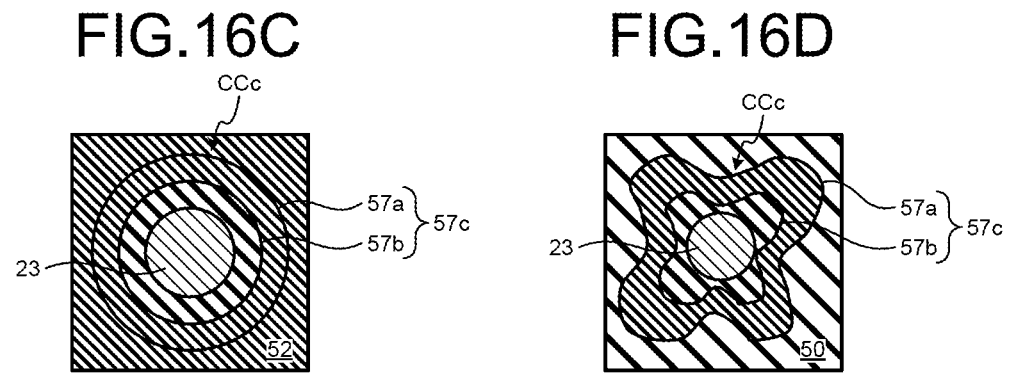

FIGS. 16C and 16D are cross-sectional views taken along the XY-plane of a contact CCc, wherein FIG. 16C illustrates a cross section of the contact CCc at and around the upper end in the stacking direction of the stacked body LM, and FIG. 16D illustrates a cross section of the contact CCc at and around the lower end.

As illustrated in FIGS. 16A and 16B, the semiconductor memory device 2 has a lead-out region LR in which the contact CCc is embedded in the stacked body LM, typically in place of the aforementioned staircase region SR.

In the lead-out region LR, there is arranged a plurality of contacts CCc that extends in the stacked body LM in the stacking direction, and reaches the depth of the word lines WL in different tiers.

The cross section in FIG. 16A illustrates a plurality of contacts CCc connected to each of the word lines WL in the uppermost layer, in the fourth layer from the uppermost layer, and in the seventh layer from the uppermost layer. The cross section in FIG. 16B illustrates a plurality of contacts CCc connected to each of the word lines WL in the third layer from the uppermost layer, in the sixth layer from the uppermost layer, and in the lowermost layer. In any cross section different from those illustrated in FIGS. 16A and 16B, there are arranged a plurality of contacts CCc that is connected to each of a plurality word lines WL connected to none of the contacts CCc illustrated in FIGS. 16A and 16B.

Hence, the plurality of contacts CCc is connected, at the lower end thereof, to each of the word lines WL in the different tiers, and through which the word lines WL may be electrically led out to the upper wiring MX. Note that a layout of the plurality of contacts CCc, connected to each of the word lines WL in the different tiers, is not limited to the case illustrated in FIGS. 16A and 16B.

Each contact CCc has an insulating layer 57*c* that covers the sidewall of the contact CCc, and a conductive layer 23 filled inside the insulating layer 57*c*. The conductive layer 23 may be made of the same material as the conductive layer 23 in the aforementioned first embodiment.

As illustrated in FIGS. 16C and 16D, the insulating layer 57*c* has typically applied thereto the structures same as the insulating layers 55 and 58 in the aforementioned first and second embodiments or in the modified example, with the insulating layer 57*a* arranged on the outer circumferential side, and with the insulating layer 57*b* arranged on the inner side.

Hence, even in an exemplary case where the insulating layers 57*a* and 57*b* have irregular outer circumferential faces with non-uniform thickness at the lower end of the contact CCc, the conductive layer 23 has a relatively smooth and less irregular outer circumferential face.

The insulating layers 57*a* and 57*b* are typically formed of silicon oxide layers, similarly to the insulating layers 55*a* and 55*b* in the aforementioned first embodiment. The insulating layer 57*b* may typically be a silicon oxynitride layer, similarly to the insulating layer 58*b* in the aforementioned second embodiment.

Note that the insulating layer 57*c* on the sidewall of the contact CCc may be made thicker than the insulating layer 57 on the sidewall of the aforementioned contact CC. This successfully suppresses electrical short-circuiting typically between the contact CCc and the word line WL except the corresponding word line WL to be connected the contact CCc, even if the contact CCc is arranged in the stacked body LM.

In the semiconductor memory device 2 of other embodiment, the contact CCc has, as a liner, the insulating layer 57*c* that contains the insulating layers 57*a* and 57*b*. This demonstrates effects same as those obtainable from the through-contact C4 in the aforementioned first embodiment.

The peripheral circuit CUA, having been described in the first and second embodiments and in the modified example, was arranged below the stacked body LM. Layout of the peripheral circuit CUA may however be different, typically in a case where the aforementioned structure is applied to the contact CCc that is arranged in the stacked body LM.

In an exemplary structure, the stacked body LM may be arranged on the substrate SB on which the peripheral circuit CUA is arranged, making the peripheral circuit CUA and the stacked body LM belong to the same tier. The peripheral circuit CUA in this case may be arranged in a peripheral region of the stacked body LM.

Alternatively, the peripheral circuit CUA may be arranged above the stacked body LM. The thus arranged semiconductor memory device in this case is obtainable by forming the stacked body LM with various structures on a substrate independent of a substrate having the peripheral circuit CUA, and then by bonding the substrate having the peripheral circuit CUA formed thereon and the substrate having the stacked body LM formed thereon.

Although having been described, in the first and second embodiments and in the modified example, that the semiconductor layer 25b or the silicon nitride layer or the like was smoothened by wet etching, a technique for smoothening is not limited thereto. For example, dry etching in which chemical reaction prevails, such as chemical dry etching (CDE), may be used for the smoothening.

Although having been described, in the first and second embodiments and in the modified example, that the pillar PL was connected to the source line SL at the side face of the channel layer CN, the structure is not limited thereto. For example, the memory layer at the bottom of the pillar may be removed, and the pillar may be connected with the source line at the lower end of the channel layer.

Also having been described in the first and second embodiments and in the modified example that the stacked body LMs was formed by alternately stacking the insulating layers NL and OL. The stacked body LMs may, however, be formed while being divided into a plurality of tiers, wherein the pillar PL, the columnar portion HR, and the step SP may be formed every time one tier of the stacked body LMs is formed. The number of the stacked word lines WL may further be increased in this way.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a stacked body in which a plurality of first conductive layers and a plurality of first insulating layers are alternately stacked one by one;
a plurality of pillars that extends in the stacked body in a stacking direction of the stacked body, and each forms a memory cell at respective intersections with at least a part of the plurality of first conductive layers; and
a contact that extends in the stacked body in the stacking direction, and is connected to a structure arranged in the stacked body or below the stacked body,
the contact comprising:

a second conductive layer that extends in the stacked body in the stacking direction, and serves as a core of the contact; and
a second insulating layer that covers a sidewall of the second conductive layer, and serves as a liner of the contact, and
a first variation being larger than a second variation, wherein
the first variation and the second variation are on a cross section of the contact intersecting the stacking direction including a portion of the contact close to the structure in the stacking direction,
the first variation is a variation among first distances from a center point of the second conductive layer to any points on an outer edge of the second insulating layer,
the second variation is a variation among second distances from the center point of the second conductive layer to any points on an outer edge of the second conductive layer, and
the first variation on the cross section including the portion of the contact is larger than a third variation among the first distances on another cross section of the contact intersecting the stacking direction including another portion of the contact farther away from the structure in the stacking direction than the portion of the contact is.

2. The semiconductor memory device according to claim 1, wherein
the second insulating layer includes, at least at the portion of the contact,
a third insulating layer that is arranged on an outer circumferential side of the contact while including the outer edge of the second insulating layer; and
a fourth insulating layer that is arranged to adjoin the outer edge of the second conductive layer, and on an inner side of the contact than the third insulating layer.

3. The semiconductor memory device according to claim 2, wherein
the third insulating layer continuously covers a circumference of the second conductive layer, and
the fourth insulating layer continuously or intermittently covers the circumference of the second conductive layer.

4. The semiconductor memory device according to claim 2, wherein
the fourth insulating layer is not arranged at another portion of the contact farther away from the structure in the stacking direction than the portion of the contact is.

5. The semiconductor memory device according to claim 2, wherein
an average grain diameter of crystals contained in the fourth insulating layer is larger than an average grain diameter of crystals contained in the third insulating layer.

6. The semiconductor memory device according to claim 2, wherein
the third insulating layer contains silicon oxide, and
the fourth insulating layer contains silicon oxynitride.

7. The semiconductor memory device according to claim 2, wherein
an end portion of the fourth insulating layer close to the structure in the stacking direction terminates below an end portion of the third insulating layer close to the structure in the stacking direction.

8. The semiconductor memory device according to claim 2, wherein an end portion of the fourth insulating layer close to the structure in the stacking direction is arranged on the outer circumferential side of the contact, than an end portion of the third insulating layer close to the structure in the stacking direction.

9. The semiconductor memory device according to claim 2, wherein an end portion of the third insulating layer close to the structure in the stacking direction is arranged on the outer circumferential side of the contact, than an end portion of the fourth insulating layer close to the structure in the stacking direction.

10. A semiconductor memory device comprising:

a stacked body in which a plurality of first conductive layers and a plurality of first insulating layers are alternately stacked one by one;

a plurality of pillars that extends in the stacked body in a stacking direction of the stacked body, and each forms a memory cell at respective intersections with at least a part of the plurality of first conductive layers; and a contact that extends in the stacked body in the stacking direction, and is connected to a structure arranged in the stacked body or below the stacked body, the contact comprising:

a second conductive layer that extends in the stacked body in the stacking direction, and serves as a core of the contact; and a second insulating layer that covers a sidewall of the second conductive layer, and serves as a liner of the contact, and at least at a portion of the contact close to the structure in the stacking direction, a roughness of an outer circumferential face of the second conductive layer, is lower than a roughness of an outer circumferential face of the second insulating layer.

11. The semiconductor memory device according to claim 10, wherein the roughness of the second insulating layer at the portion of the contact is higher than the roughness of the second insulating layer at another portion of the contact farther away from the structure in the stacking direction than the portion of the contact is.

12. The semiconductor memory device according to claim 10, wherein the second insulating layer includes, at least at the portion of the contact, a third insulating layer that is arranged on an outer circumferential side of the contact while including the outer circumferential face of the second insulating layer; and a fourth insulating layer that is arranged to adjoin the outer circumferential face of the second conductive layer, and on an inner side of the contact than the third insulating layer.

13. The semiconductor memory device according to claim 12, wherein the third insulating layer continuously covers a circumference of the second conductive layer, and the fourth insulating layer continuously or intermittently covers the circumference of the second conductive layer.

14. The semiconductor memory device according to claim 12, wherein the fourth insulating layer is not arranged at another portion of the contact farther away from the structure in the stacking direction than the portion of the contact is.

15. The semiconductor memory device according to claim 12, wherein an average grain diameter of crystals contained in the fourth insulating layer is larger than an average grain diameter of crystals contained in the third insulating layer.

16. The semiconductor memory device according to claim 12, wherein the third insulating layer contains silicon oxide, and the fourth insulating layer contains silicon oxynitride.

17. A semiconductor memory device comprising:

a stacked body in which a plurality of first conductive layers and a plurality of first insulating layers are alternately stacked one by one;

a plurality of pillars that extends in the stacked body in a stacking direction of the stacked body, and each forms a memory cell at respective intersections with at least a part of the plurality of first conductive layers; and a contact that extends in the stacked body in the stacking direction, and is connected to one of the plurality of first conductive layers, the contact comprising:

a second conductive layer that extends in the stacked body in the stacking direction, and serves as a core of the contact; and a second insulating layer that covers a sidewall of the second conductive layer, and serves as a liner of the contact, a first variation being larger than a second variation, wherein the first variation and the second variation are on a cross section of the contact intersecting the stacking direction including a portion of the contact close to the one of the plurality of first conductive layers in the stacking direction, the first variation is a variation among first distances from a center point of the second conductive layer to any points on an outer edge of the second insulating layer, the second variation is a variation among second distances from the center point of the second conductive layer to any points on an outer edge of the second conductive layer, and the first variation on the cross section including the portion of the contact is larger than a third variation among the first distances on another cross section of the contact intersecting the stacking direction and including another portion of the contact farther away from the one of the plurality of first conductive layers in the stacking direction than the portion of the contact is.

18. The semiconductor memory device according to claim 17, wherein the second insulating layer includes, at least at the portion of the contact, a third insulating layer that is arranged on an outer circumferential side of the contact while including the outer edge of the second insulating layer; and a fourth insulating layer that is arranged to adjoin the outer edge of the second conductive layer, and on an inner side of the contact than the third insulating layer.

* * * * *